(12) United States Patent
Greene et al.

(10) Patent No.: US 11,315,922 B2
(45) Date of Patent: Apr. 26, 2022

(54) FIN CUT TO PREVENT REPLACEMENT GATE COLLAPSE ON STI

(71) Applicant: International Business Machines Corporation, Armonk, NY (US)

(72) Inventors: Andrew M. Greene, Slingerlands, NY (US); Balasubramanian Pranatharthiharan, Watervliet, NY (US); Sivananda K. Kanakasabapathy, Pleasanton, CA (US); John R. Sporre, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/807,731

(22) Filed: Mar. 3, 2020

(65) Prior Publication Data
US 2020/0219874 A1 Jul. 9, 2020

Related U.S. Application Data

(62) Division of application No. 15/415,446, filed on Jan. 25, 2017, now Pat. No. 10,622,352.

(51) Int. Cl.
*H01L 29/165* (2006.01)
*H01L 27/088* (2006.01)
(Continued)

(52) U.S. Cl.
CPC .... *H01L 27/0886* (2013.01); *H01L 21/76224* (2013.01); *H01L 21/823431* (2013.01); *H01L 21/823437* (2013.01); *H01L 21/823481* (2013.01); *H01L 21/823821* (2013.01); *H01L 21/823842* (2013.01); *H01L 21/823878* (2013.01); *H01L 27/0924* (2013.01);
(Continued)

(58) Field of Classification Search
None
See application file for complete search history.

(56) References Cited

U.S. PATENT DOCUMENTS 6,864,164 B1   3/2005   Dakshina-Murthy et al.
7,198,995 B2   4/2007   Chidambarrao et al.
(Continued)

OTHER PUBLICATIONS

Mackenzie et al., "Stress Control of Si-Based PECVD Dielectrics," Proc. Symp. Silicon Nitride and Silicon Dioxide Thin Insulating Films & Other Emerging Dielectrics VIII, PV2005-01, 148-159 (May 2005).
(Continued)

*Primary Examiner* — Joseph C. Nicely
*Assistant Examiner* — Lamont B Koo
(74) *Attorney, Agent, or Firm* — Robert Sullivan; Michael J. Chang, LLC

(57) ABSTRACT

The present invention provides fin cut techniques in a replacement gate process for finFET fabrication. In one aspect, a method of forming a finFET employs a dummy gate material to pin a lattice constant of patterned fins prior to a fin cut thereby preventing strain relaxation. A dielectric fill in a region of the fin cut (below the dummy gates) reduces an aspect ratio of dummy gates formed from the dummy gate material in the fin cut region, thereby preventing collapse of the dummy gates. FinFETs formed using the present process are also provided.

20 Claims, 19 Drawing Sheets

(51) Int. Cl.

| | | |
|---|---|---|
| *H01L 29/66* | (2006.01) | |
| *H01L 29/06* | (2006.01) | |
| *H01L 21/762* | (2006.01) | |
| *H01L 21/8234* | (2006.01) | |
| *H01L 29/78* | (2006.01) | |
| *H01L 29/51* | (2006.01) | |
| *H01L 29/49* | (2006.01) | |
| *H01L 21/8238* | (2006.01) | |
| *H01L 27/092* | (2006.01) | |

(52) U.S. Cl.
CPC ........ *H01L 29/0649* (2013.01); *H01L 29/495* (2013.01); *H01L 29/4966* (2013.01); *H01L 29/517* (2013.01); *H01L 29/6656* (2013.01); *H01L 29/66545* (2013.01); *H01L 29/66795* (2013.01); *H01L 29/7842* (2013.01); *H01L 29/7851* (2013.01)

(56) References Cited

U.S. PATENT DOCUMENTS

| | | | |
|---|---|---|---|
| 8,735,869 B2 | 5/2014 | Cappellani et al. | |
| 8,815,670 B2 | 8/2014 | Basker et al. | |
| 9,064,932 B1 | 6/2015 | Pham et al. | |
| 9,093,379 B2 | 7/2015 | Guillorn et al. | |
| 9,123,654 B2 | 9/2015 | Leobandung | |
| 9,153,693 B2 | 10/2015 | Yu et al. | |
| 2014/0203362 A1 | 7/2014 | Kim et al. | |
| 2014/0264603 A1 | 9/2014 | He et al. | |
| 2014/0353763 A1* | 12/2014 | Chung | H01L 27/0886 257/390 |
| 2015/0054089 A1* | 2/2015 | Hong | H01L 29/161 257/401 |
| 2015/0214341 A1* | 7/2015 | Shin | H01L 29/7851 257/401 |
| 2015/0249127 A1 | 9/2015 | Xie et al. | |
| 2015/0263131 A1 | 9/2015 | Metz | |
| 2015/0333145 A1 | 11/2015 | Chudzik et al. | |
| 2015/0333155 A1 | 11/2015 | Liu et al. | |
| 2016/0056181 A1 | 2/2016 | Anderson et al. | |
| 2016/0087063 A1 | 3/2016 | Yin et al. | |
| 2016/0163604 A1 | 6/2016 | Xie et al. | |
| 2017/0033217 A1* | 2/2017 | Hong | H01L 29/7848 |
| 2017/0053835 A1* | 2/2017 | Sung | H01L 29/1054 |
| 2017/0141211 A1* | 5/2017 | Xie | H01L 29/785 |
| 2017/0200651 A1* | 7/2017 | Lee | H01L 21/76224 |
| 2017/0345936 A1 | 11/2017 | Ching et al. | |

OTHER PUBLICATIONS

List of IBM Patents or Applications Treated as Related (2 pages).

* cited by examiner

FIN CUT TO PREVENT REPLACEMENT GATE COLLAPSE ON STI

CROSS-REFERENCE TO RELATED APPLICATIONS

This application is a divisional of U.S. application Ser. No. 15/415,446 filed on Jan. 25, 2017, now U.S. Pat. No. 10,622,352, the contents of which are incorporated by reference herein.

FIELD OF THE INVENTION

The present invention relates to fin field-effect transistor (finFET) fabrication and more particularly, to fin cut techniques in a replacement gate process for finFET fabrication to prevent replacement gate collapse on shallow trench isolation (STI).

BACKGROUND OF THE INVENTION

During fin field-effect transistor (finFET) fabrication, a sea of fins can be patterned on a wafer, and then cut into individual devices. During this fin cut, however, channel strain becomes a concern, especially at scaled technology nodes where dimensions are reduced.

For instance, if the ends of the fins are cut after they are patterned, this can cause strain relaxation in cut fin segments. Strain relaxation impairs device performance by causing mobility degradation.

Also, during a subsequent replacement gate process, any sacrificial or dummy gates that are formed on a shallow trench isolation (STI) oxide between the cut ends of the fins are prone to collapse due to their high-aspect-ratio structure and undercutting of the underlying STI oxide. Dummy gate collapse can lead to spacer merging, incomplete spacer etch and/or complete dummy gate collapse, all of which are undesirable effects.

Accordingly, an improved replacement gate process which addresses the above-described challenges would be desirable.

SUMMARY OF THE INVENTION

The present invention provides fin cut techniques in a replacement gate process for fin field effect transistor (finFET) fabrication. In one aspect of the invention, a method of forming a finFET is provided. The method includes: patterning at least one fin in a substrate; forming an oxide layer on the at least one fin; depositing a first dummy gate material onto the oxide layer over the at least one fin, wherein the first dummy gate material serves to pin a lattice constant of the at least one fin; forming a trench in the first dummy gate material and the oxide layer over at least one region of the at least one fin; extending the trench into the substrate, removing the at least one region of the at least one fin; partially filling the trench with a first dielectric to a level above the at least one fin; depositing a second dummy gate material into the trench on top of the first dielectric; patterning the first dummy gate material and the second dummy gate material into dummy gates, wherein at least one of the dummy gates is disposed on the first dielectric and at least another one of the dummy gates is disposed on the at least one fin, and wherein the at least one dummy gate disposed on the first dielectric has an aspect ratio less than an aspect ratio of the at least one dummy gate disposed on the at least one fin; surrounding the dummy gates with a second dielectric; selectively removing the dummy gates forming gate trenches in the second dielectric; and forming replacement gates in the gate trenches.

In another aspect of the invention, a finFET is provided. The finFET includes: at least one fin on a substrate, wherein a cut is present in the at least one fin that divides the at least one fin into multiple segments; a first dielectric within the cut separating the multiple segments of the at least one fin; gates over the at least one fin, wherein at least one of the gates is disposed on the first dielectric and at least another one of the gates is disposed on the at least one fin, and wherein the at least one gate disposed on the first dielectric has an aspect ratio less than an aspect ratio of the at least one gate disposed on the at least one fin; and a second dielectric surrounding the gates.

In yet another aspect of the invention, another method of forming a finFET is provided. The method includes: patterning at least one fin in a substrate; forming an oxide layer on the at least one fin; depositing a dummy gate material onto the oxide layer over the at least one fin, wherein the first dummy gate material serves to pin a lattice constant of the at least one fin; forming a trench in the dummy gate material and the oxide layer over at least one region of the at least one fin; extending the trench into the substrate, removing the at least one region of the at least one fin; filling the trench with a first dielectric; patterning the dummy gate material into dummy gates, wherein the first dielectric is at a same height as the dummy gates; surrounding the dummy gates with a second dielectric; selectively removing the dummy gates forming gate trenches in the second dielectric; and forming replacement gates in the gate trenches.

In still yet another aspect of the invention, another finFET is provided. The finFET includes: at least one fin on a substrate, wherein a cut is present in the at least one fin that divides the at least one fin into multiple segments; a first dielectric within the cut separating the multiple segments of the at least one fin; gates over the at least one fin, wherein the first dielectric is at a same height as the gates; and a second dielectric surrounding the gates.

A more complete understanding of the present invention, as well as further features and advantages of the present invention, will be obtained by reference to the following detailed description and drawings.

DETAILED DESCRIPTION OF PREFERRED EMBODIMENTS

Figure 1:
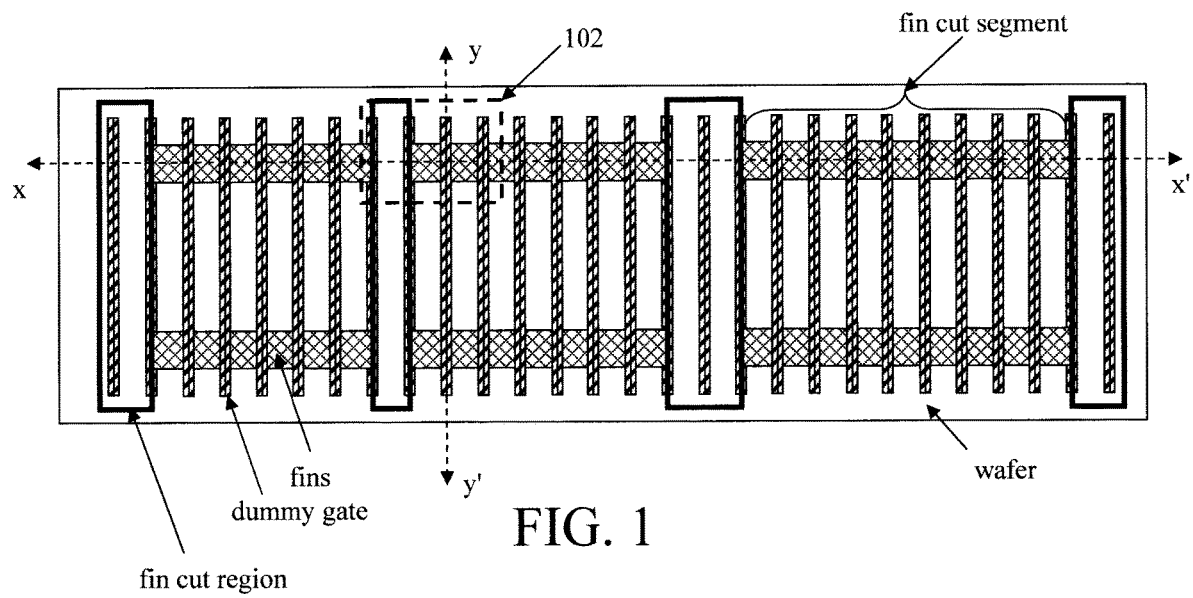
FIG. 1 is a diagram illustrating an exemplary schematic diagram of a logic bit cell according to an embodiment of the present invention.

As described above, finFET fabrication can include patterning a plurality of fins on a wafer and then cutting the fins into individual devices. See FIG. 1. FIG. 1 is a schematic diagram of a logic bit cell in which the present techniques can be implemented. As shown in FIG. 1, multiple fins are patterned on the wafer. A fin cut etch is then used to divide up the fins into individual devices/cells. The regions of the fins cut are shown within bold boxes. As also shown in FIG. 1, multiple dummy gates run perpendicular to the fins. As highlighted above, dummy gates are part of a gate last or replacement metal gate (RMG) process in which the dummy gates are placed over the channel region early in the process and essentially serve as placeholders for replacement (e.g., metal) gates that will be swapped for the dummy gates at the end of the process. The dummy gates permit placement of gate spacers, formation of source and drains and associated implants, etc. Notably, a gate last approach prevents the replacement gate from being exposed to potentially damaging process conditions (such as high temperatures) since it is placed later in the process.

One challenge in the replacement gate process is that the dummy gates in the fin cut regions (see FIG. 1—those dummy gates present within the bold boxes) are not anchored by a fin. The dummy gates are high aspect ratio structures (i.e., taller than wide) which can bend due to stress build-up. Thus, any undercutting at or below the base of the dummy gates (which can occur during gate and/or spacer patterning) can cause the dummy gates to flop over or, in the worst case scenario, completely collapse onto one another. Advantageously, in accordance with the present techniques, the fin cut is followed by an insulator fill to reduce the effective aspect ratio of the dummy gates on shallow trench isolation (STI). This reduction in aspect ratio minimizes the required dummy gate etch depth and final dummy gate height on STI which reduces bending and potential flop over. Specifically, STI is used to isolate individual devices. STI generally involves patterning a trench between the active areas of different devices, and then filling the trench with a dielectric such as an oxide material (which is also referred to as an "STI oxide") to isolate the devices. With conventional approaches, the fin cut and STI are performed prior to placing the dummy gates. Thus, when formed, some of the dummy gates will be disposed over the STI. These dummy gates over the STI have no fin to anchor to and thus can bend or even collapse. However, in accordance with the present techniques, the fin cut is performed after the dummy gate deposition so that all gates are provided with a fin to anchor to prior to the fin cut. Following the fin cut and STI, a refill of the dummy gate material in the fin cut regions can be performed over the STI (see below), however these dummy gates on STI will have a reduced aspect ratio.

Another challenge to the above-described process is that cutting the fins relaxes the (beneficial) strain. Thus, an effective mechanism is needed to preserve the strain in the fins. Advantageously, in accordance with the present techniques, the dummy gate material (e.g., amorphous silicon (Si)) is deposited prior to the fin cut, thereby permitting the strain to be maintained without relaxation.

FIG. 1 presents a top-down view. The figures that follow depict cross-sectional cuts either perpendicular to the fins (along the y-y' direction) or parallel with the fins (along the x-x' direction). See FIG. 1. For ease and clarity of depiction, only a section 102 of the layout is shown in the figures that follow. However, the processes illustrated for that section 102 are implemented in practice over the entire layout.

Figure 2:
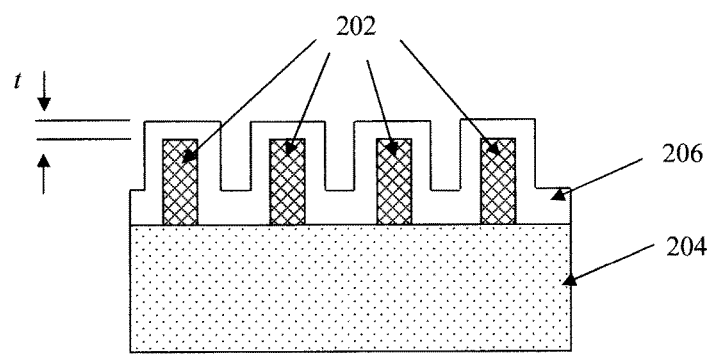
FIG. 2 is a cross-sectional diagram along y-y' (i.e., across the fins) illustrating fins having been patterned in a wafer, and an oxide layer having been formed on the fins according to an embodiment of the present invention.

A first exemplary embodiment is now described by way of reference to FIGS. 2-30. As shown in FIG. 2, the process begins with a plurality of fins 202 having been patterned in a substrate 204. FIG. 2 depicts a cross-sectional cut along the y-y' direction. According to an exemplary embodiment substrate 204 is a bulk semiconductor (e.g., silicon, germanium, silicon germanium, etc.) wafer. Standard lithography and etching techniques can be employed to pattern the fins 202.

It is at this point that conventional processes often involve a fin end cut (wherein cuts are performed to divide each of the patterned fins into multiple segments). However, as described above, this can cause strain relaxation in the cut segments, which is undesirable. While fin end cuts will be performed in the present process flow, they are performed later in the process, after the strain in the fins is locked in by the dummy gates. It is notable that while the instant example is focused on technology for fin end cut, the present techniques can be applied in the same manner described to a block mask for sets of fins or to single fin cuts. With a block mask, for example, block sets/arrays of fins would be masked rather than end cut (i.e., this would preserve fins which one does not want to be cut). A block mask would also allow for tapered devices and various shapes/patterns of fins. Thus a block mask can be implemented in accordance with the present techniques to preserve some fins while exposing other fins to be end cut.

As shown in FIG. 2, an oxide layer 206 is then formed (e.g., deposited or grown) on the fins 202. The oxide layer 206 can be grown on the fins using a thermal oxidation process. In that case, oxide layer 206 may also be referred to herein as a thermal oxide. Suitable oxide materials include, but are not limited to, silicon dioxide ($SiO_2$). According to an exemplary embodiment, oxide layer 206 is formed having a thickness t of from about 2 nanometers (nm) to about 8 nm, and ranges therebetween.

Figure 3:
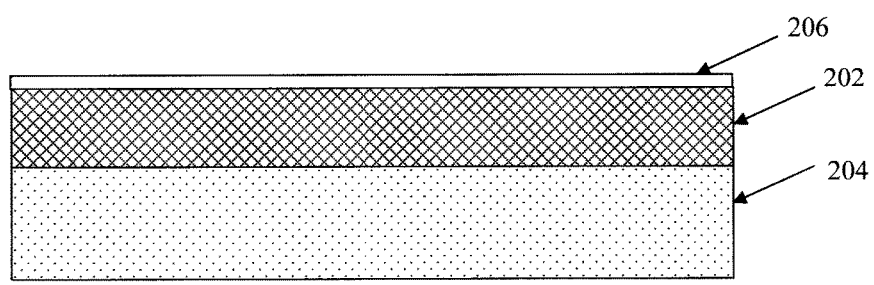
FIG. 3 is a cross-sectional diagram along x-x' (i.e., along the fins) illustrating, from another perspective, the fins patterned in the wafer, and the oxide layer on the fins according to an embodiment of the present invention.

FIG. 3 is a cross-sectional diagram illustrating the fins 202 patterned in the wafer 204, and the oxide layer 206 over the fins 202. FIG. 3 depicts the structure from another perspective (i.e., a cross-sectional cut along the x-x' direction).

Figure 4:
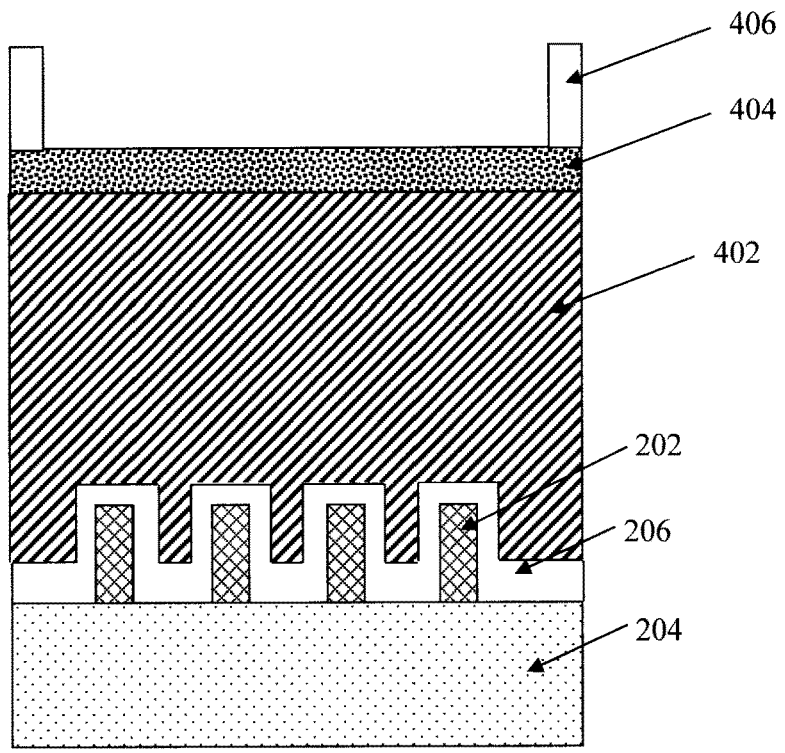
FIG. 4 is a cross-sectional diagram along y-y' illustrating a first dummy gate material having been deposited over the fins and oxide layer, followed by a hardmask and a fin cut patterning stack deposition according to an embodiment of the present invention.

Next, a dummy gate material 402 is deposited over the fins 202 and oxide layer 206 and planarized. See FIG. 4. FIG. 4 depicts a cross-sectional cut along the y-y' direction. Suitable dummy gate materials include, but are not limited to, amorphous silicon. The dummy gate material 402 can be planarized using a process such as chemical mechanical polishing or CMP. The dummy gate material 402 is preferably planarized down to a thickness that is at least about 5 nm greater than the final target thickness of the material.

A hardmask 404 is then deposited onto the planarized dummy gate material 402 as an etch mask layer, followed by a fin cut patterning stack 406. See FIG. 4. Suitable hardmask materials include, but are not limited to, nitride hardmask materials such as silicon nitride (SiN). According to an exemplary embodiment, the patterning stack 406 includes an organic planarization layer (OPL), an antireflective coating (ARC) on the OPL, and a photoresist on the ARC. This stack is used to transfer the fin cut pattern from the photoresist into the OPL. The patterned OPL is then etched down into the active regions on the wafer. The general process for use of a tri-layer patterning process is described, for example, in U.S. Pat. No. 9,093,379 issued to Guillorn et al., entitled "Silicidation blocking process using optically sensitive HSQ resist and organic planarizing layer," the contents of which are incorporated by reference as if fully set forth herein.

As shown in FIG. 4, the fin cut patterning stack 406 is then patterned with the footprint and location of the fin cut regions (see bold boxes in FIG. 1). As will become apparent from FIG. 5 (described below), the fin cut regions are at the ends of the fins 202. Standard lithography and etching techniques can be used to pattern the stack 406.

Figure 5:
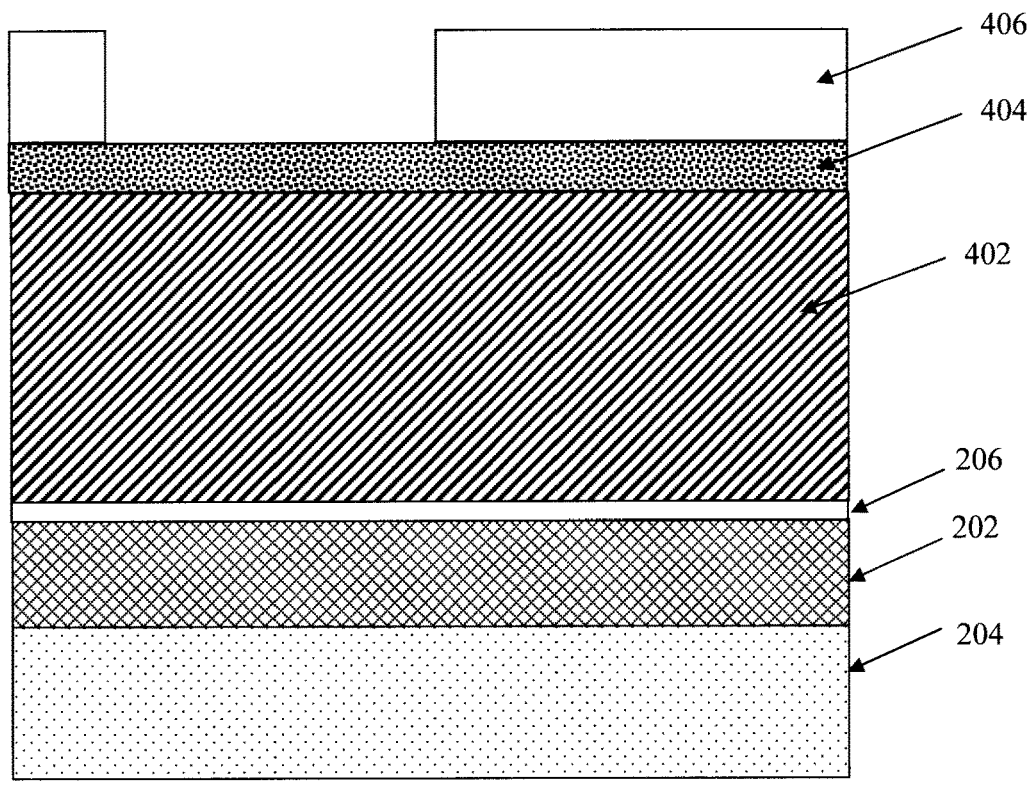
FIG. 5 is a cross-sectional diagram along x-x' illustrating, from another perspective, the first dummy gate material having been deposited over the fins and oxide layer, followed by the hardmask and the fin cut patterning stack deposition according to an embodiment of the present invention.

FIG. 5 is a cross-sectional diagram illustrating the dummy gate material 402 having been formed over the fins 202/oxide layer 206, followed by the hardmask 404 and fin cut patterning stack 406. FIG. 5 depicts the structure from another perspective (i.e., a cross-sectional cut along the x-x' direction). As shown in FIG. 5, the fin cut regions (defined by the fin cut patterned stack 406) are at the ends of the fins 202.

Advantageously, the fin lattice constant under the dummy gate is now pinned by the dummy gate material 402. Thus, when the fin cut is subsequently performed (see below), strain relaxation will be prevented, i.e., the fin strain is locked in by the already deposited dummy gate material 402.

Figure 6:
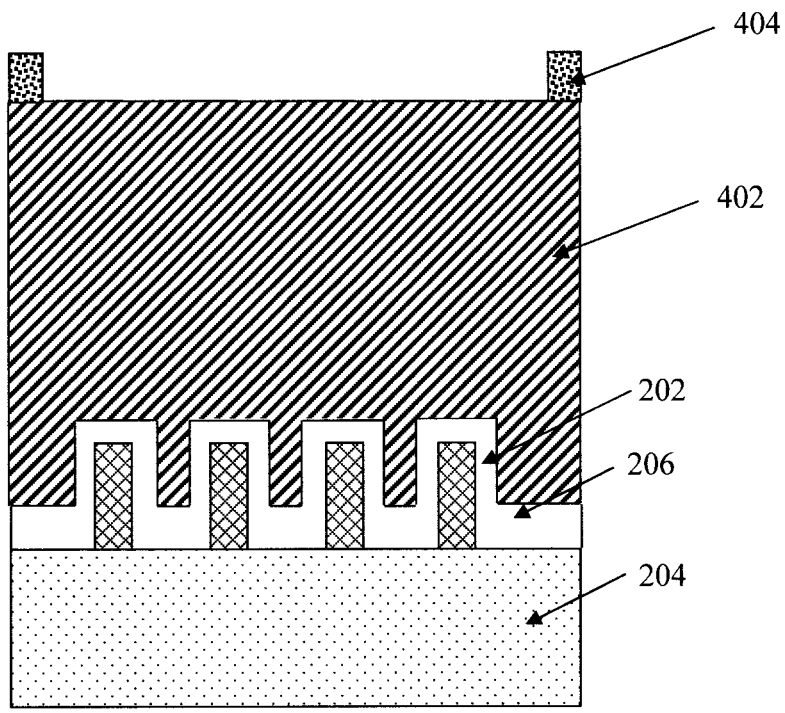
FIG. 6 is a cross-sectional along y-y' diagram illustrating the fin cut pattern from the fin cut patterning stack having been transferred to the hardmask, followed by removal of the fin cut patterning stack selective to the first dummy gate material according to an embodiment of the present invention.

The fin cut pattern from the fin cut patterning stack 406 is then transferred to the hardmask 404, followed by removal of the fin cut patterning stack 406 selective to the dummy gate material 402. See FIG. 6. FIG. 6 depicts a cross-sectional cut along the y-y' direction.

Figure 7:
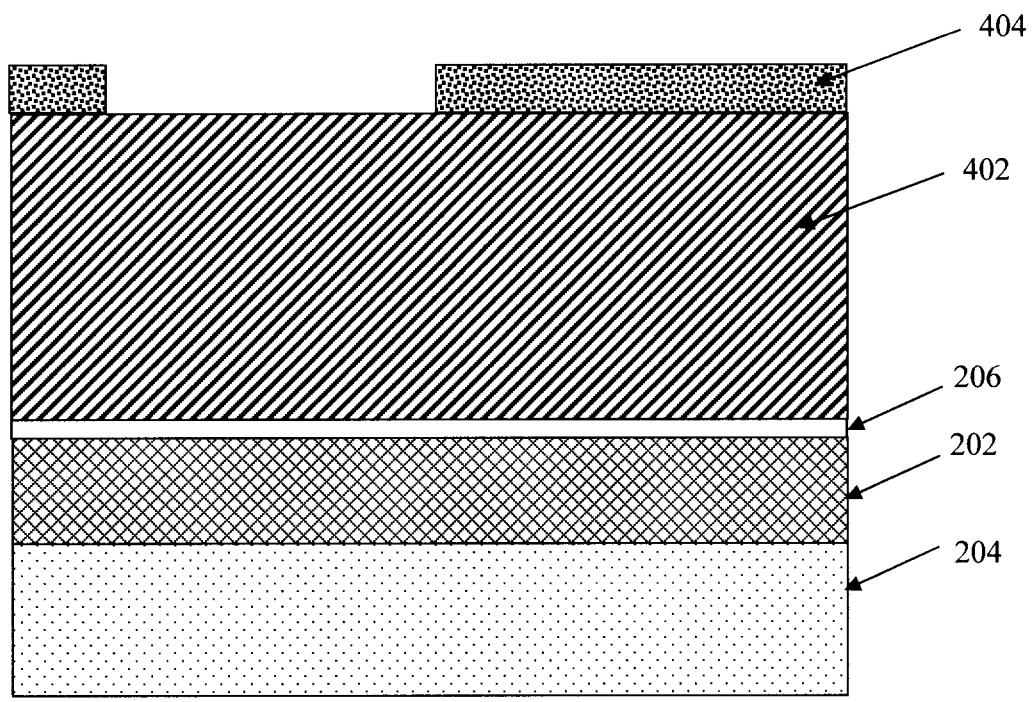
FIG. 7 is a cross-sectional diagram along x-x' illustrating, from another perspective, the fin cut pattern from the fin cut patterning stack having been transferred to the hardmask, followed by removal of the fin cut patterning stack selective to the first dummy gate material according to an embodiment of the present invention.

FIG. 7 is a cross-sectional diagram illustrating the fin cut patterning stack 406 having been transferred to the hardmask 404, followed by removal of the fin cut patterning stack 406 selective to the dummy gate material 402. FIG. 7 depicts the structure from another perspective (i.e., a cross-sectional cut along the x-x' direction).

The now-patterned hardmask 404 is then used to perform fin end cut patterning, wherein cuts are performed to divide each of the fins 202 into multiple segments. The term "end cut" indicates that the fins are cut at the ends of the segments. Specifically, referring briefly back to FIG. 1, it can be seen that the fin cut regions are present at the ends of the fin cut segments.

Figure 8:
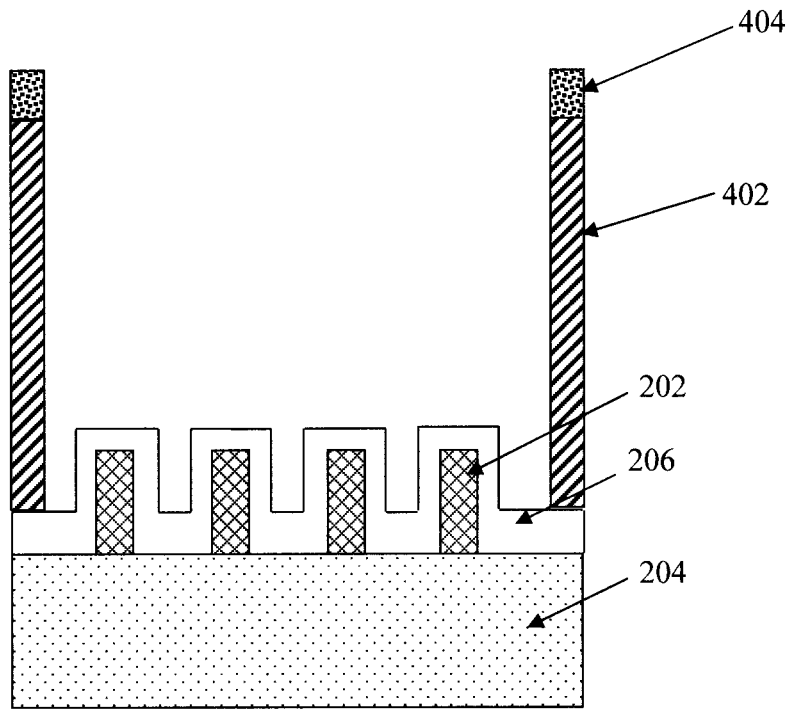
FIG. 8 is a cross-sectional diagram along y-y' illustrating the patterned hardmask having been used to etch the underlying first dummy gate material stopping on the oxide layer according to an embodiment of the present invention.
Figure 9:
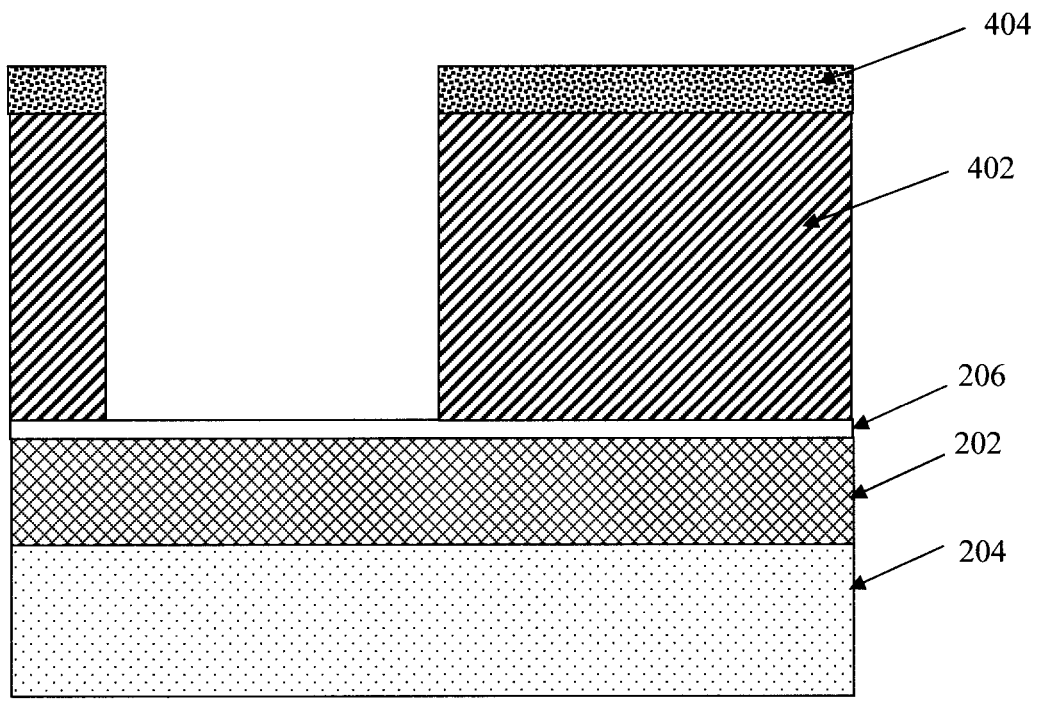
FIG. 9 is a cross-sectional diagram along x-x' illustrating, from another perspective, the patterned hardmask having been used to etch the underlying first dummy gate material stopping on the oxide layer according to an embodiment of the present invention.

The fin end cut patterning begins by first transferring the hardmask 404 pattern to the underlying dummy gate material 402 forming a trench in the dummy gate material 402. See FIG. 8. FIG. 8 depicts a cross-sectional cut along the y-y' direction. For instance, when the dummy gate material is amorphous Si, then a Si-selective anisotropic etching process can be performed stopping on the oxide layer 206 (i.e., the oxide layer 206 acts as an etch stop). By way of example only, a suitable anisotropic etching process for this step includes, but is not limited to, Si-selective reactive ion etching or RIE. FIG. 9 is a cross-sectional diagram illustrating patterning of the dummy gate material 402 from another perspective (i.e., a cross-sectional cut along the x-x' direction).

Figure 10:
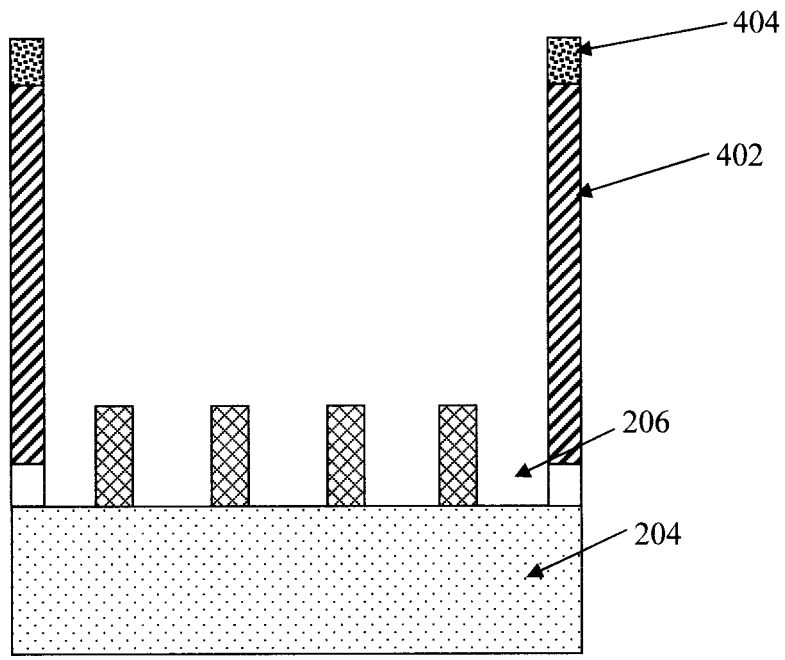
FIG. 10 is a cross-sectional diagram along y-y' illustrating the oxide layer having been patterned according to an embodiment of the present invention.
Figure 11:
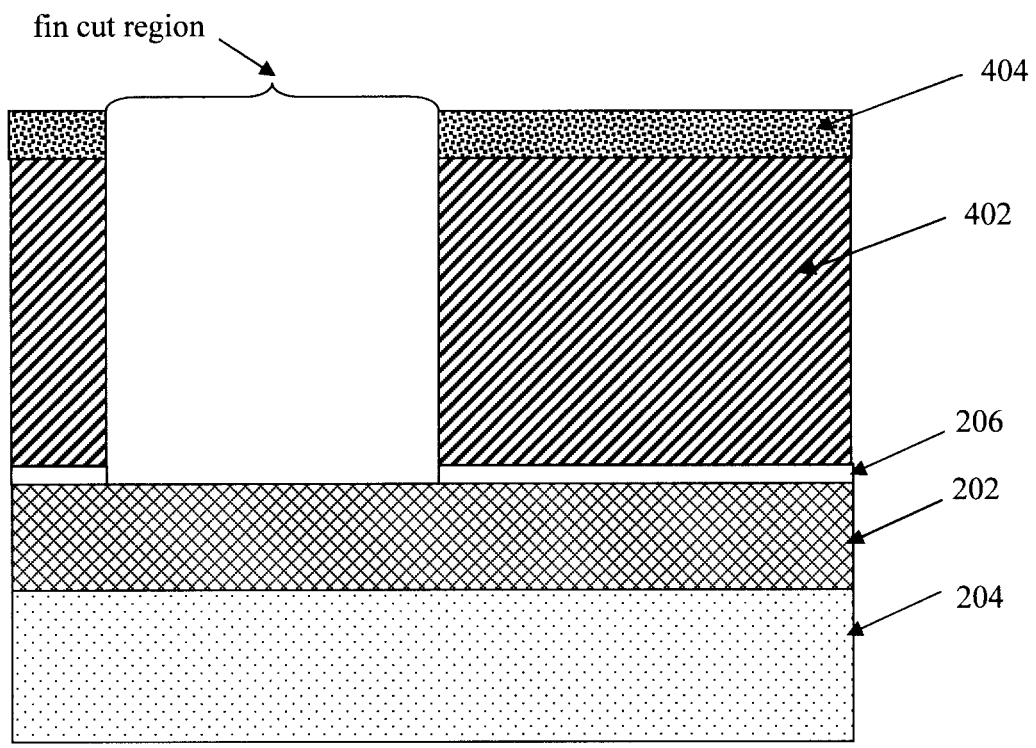
FIG. 11 is a cross-sectional diagram along x-x' illustrating, from another perspective, the oxide layer having been patterned according to an embodiment of the present invention.

The (fin end cut) pattern is then transferred to the oxide layer 206 using an oxide-selective etch, such as a wet or dry oxide-selective etching process, thereby extending the trench through the oxide layer 206. See FIG. 10. FIG. 10 depicts a cross-sectional cut along the y-y' direction. As shown in FIG. 10, this etch removes the oxide layer 206 from over the fins 202 in the fin cut regions. For better fin etch selectivity, a dry etch process is preferred. FIG. 11 is a cross-sectional diagram illustrating patterning of the oxide layer 206 from another perspective (i.e., a cross-sectional cut along the x-x' direction). As shown in FIG. 10, the dummy gate material 402 and the oxide layer 206 are removed from over a portion of the fins 202 in the fin cut region (i.e., the region in which the fin ends will be cut).

Figure 12:
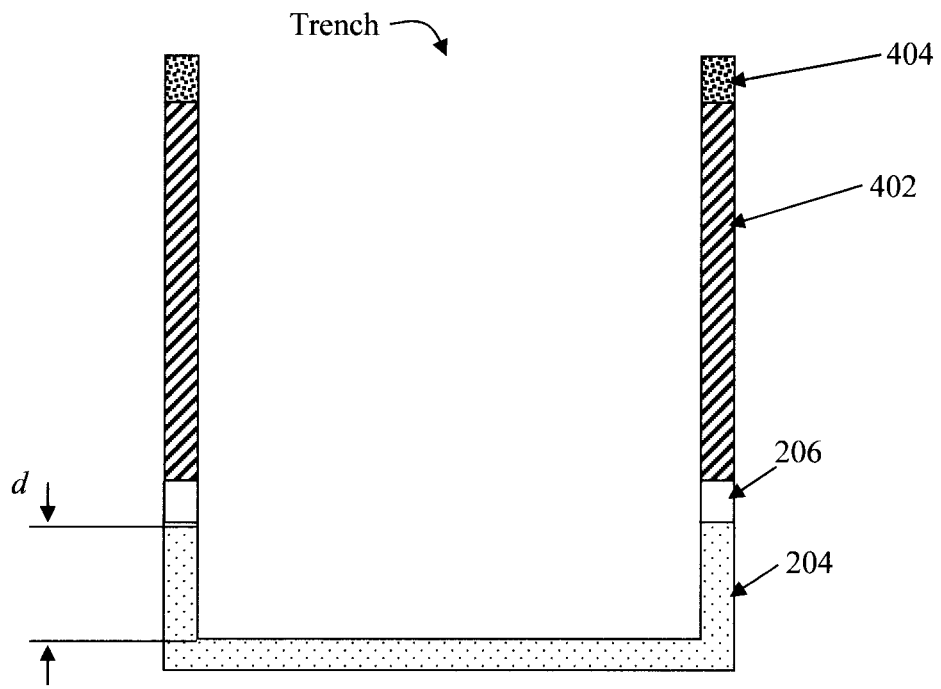
FIG. 12 is a cross-sectional diagram along y-y' illustrating the fins having been cut according to an embodiment of the present invention.

Next, the fins 202 are cut in the fin cut region. See FIG. 12. FIG. 12 depicts a cross-sectional cut along the y-y' direction. As provided above, during this fin end cut patterning, cuts are performed to divide each of the fins 202 into multiple segments. As shown in FIG. 12, the fin cut etch is performed by extending the trench through the fins 202 and into the substrate 204. By employing the oxide layer 206 over the fins 202 in conjunction with the above-described multiple etching steps, better control over the fin patterning etch can be achieved. For instance, the bulk dummy gate material 402 over the fins 202 can be easily removed since the oxide layer 206 exists as an etch stop. Following removal of the oxide layer 206, a more closely controlled etch can be performed to remove the fins 202 which is endpointed when the substrate 204 is etched to the proper depth.

Figure 13:
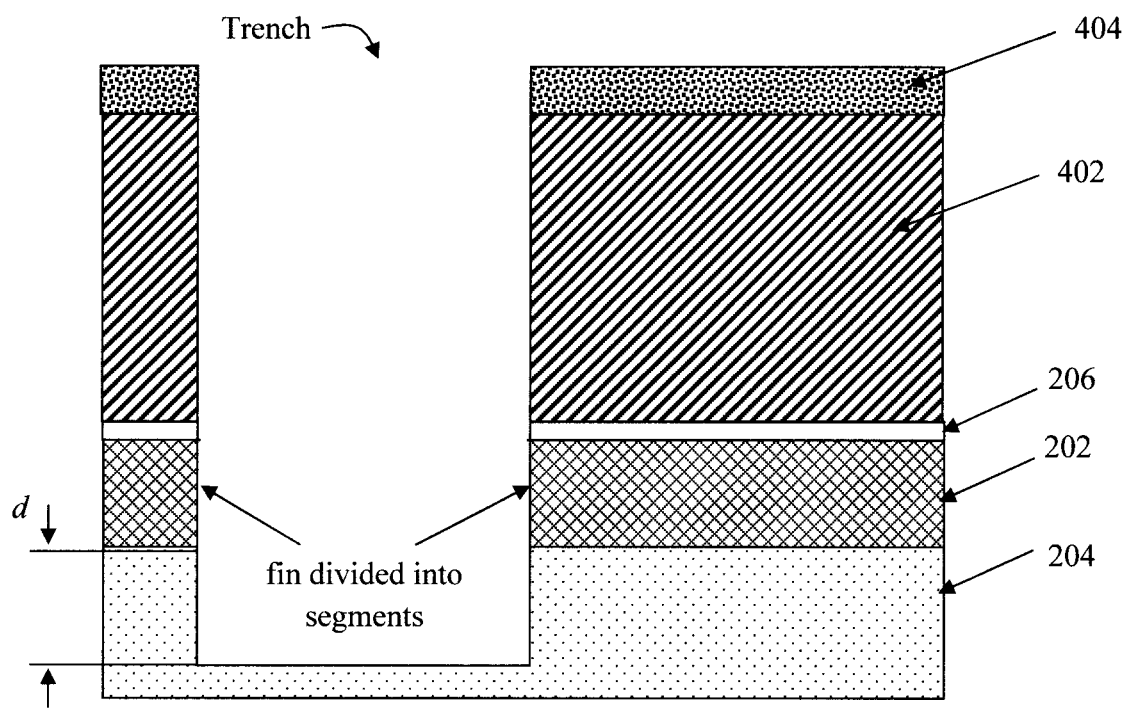
FIG. 13 is a cross-sectional diagram along x-x' illustrating, from another perspective, the fins having been cut according to an embodiment of the present invention.

Recessing of the substrate 204 (beneath the cut fin) is desirable in order to prevent well doping leakage. According to an exemplary embodiment, the substrate 204 is recessed (beneath the fins) to a depth d of from about 50 nm to about 300 nm, and ranges therebetween, depending on the required etch depth past doped regions (i.e., doped regions within and/or below the fin). Cutting the fin down into the substrate is done to fully prevent a potential leakage pathway. FIG. 13 is a cross-sectional diagram illustrating the fin cut from another perspective (i.e., a cross-sectional cut along the x-x' direction). As shown in FIG. 13, the fin cut divides each fin 202 into multiple segments.

Figure 14:
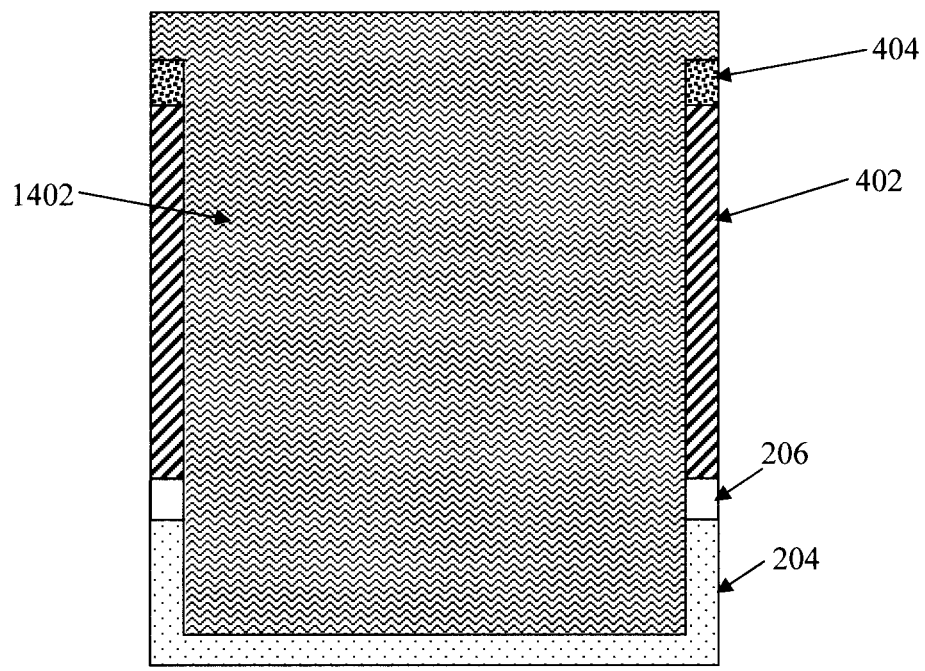
FIG. 14 is a cross-sectional diagram along y-y' illustrating a first dielectric having been deposited into the trench left by the fin cut according to an embodiment of the present invention.
Figure 15:
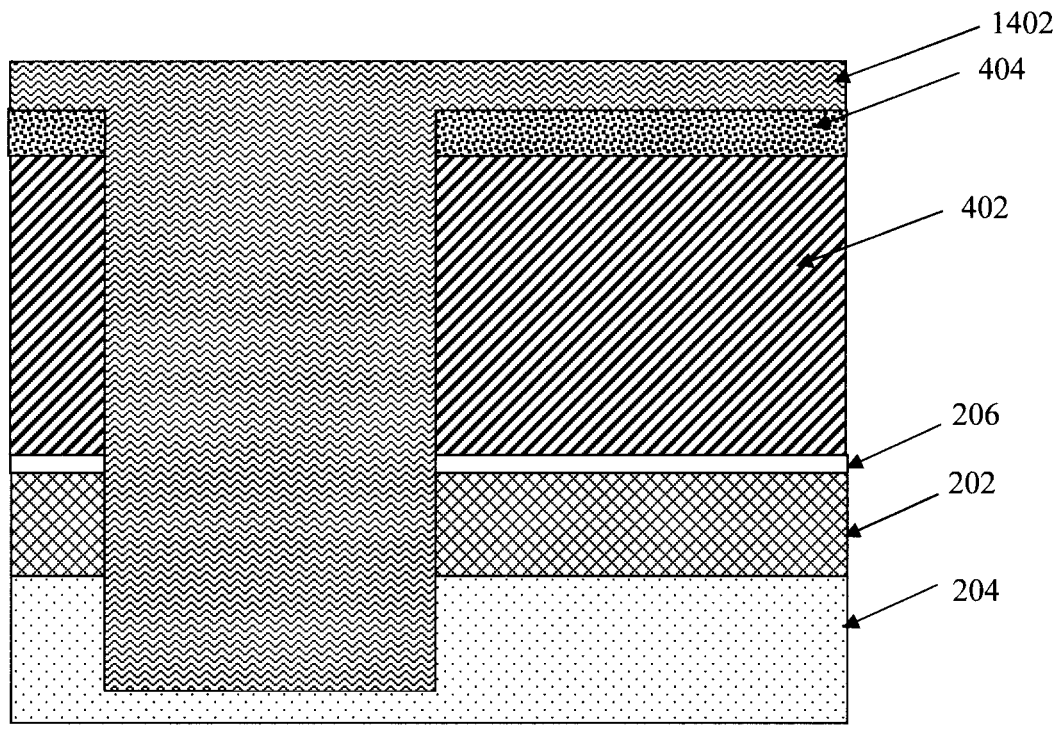
FIG. 15 is a cross-sectional diagram along x-x' illustrating, from another perspective, the first dielectric having been deposited into the trench left by the fin cut according to an embodiment of the present invention.

As shown in FIGS. 12 and 13, the fin cut etches result in the trench being formed in the fins 202, substrate 204, oxide layer 206, and dummy gate material 402. A dielectric 1402 is then deposited into, and filling, the trench left by the fin cut. See FIG. 14. FIG. 14 depicts a cross-sectional cut along the y-y' direction. As a result, the multiple fin segments resulting from the fin cut are now separated by dielectric 1402. In the manner provided above, this dielectric 1402 serves as an STI that isolates the individual devices. Dummy gates, if present, on the (STI) dielectric 1402 will have a reduced aspect ratio, and thus are less prone to bending and/or collapse. Suitable dielectrics include, but are not limited to, oxide (e.g., $SiO_2$) and nitride (e.g., SiN) materials. SiN, however, provides some notable benefits over $SiO_2$. For instance, as compared to $SiO_2$, SiN would remain intact during pre-cleans used, e.g., during spacer and replacement metal gate formation. SiN can also be configured as tensile or compressive depending on how it is deposited. FIG. 15 is a cross-sectional diagram illustrating the dielectric fill from another perspective (i.e., a cross-sectional cut along the x-x' direction).

Figure 16:
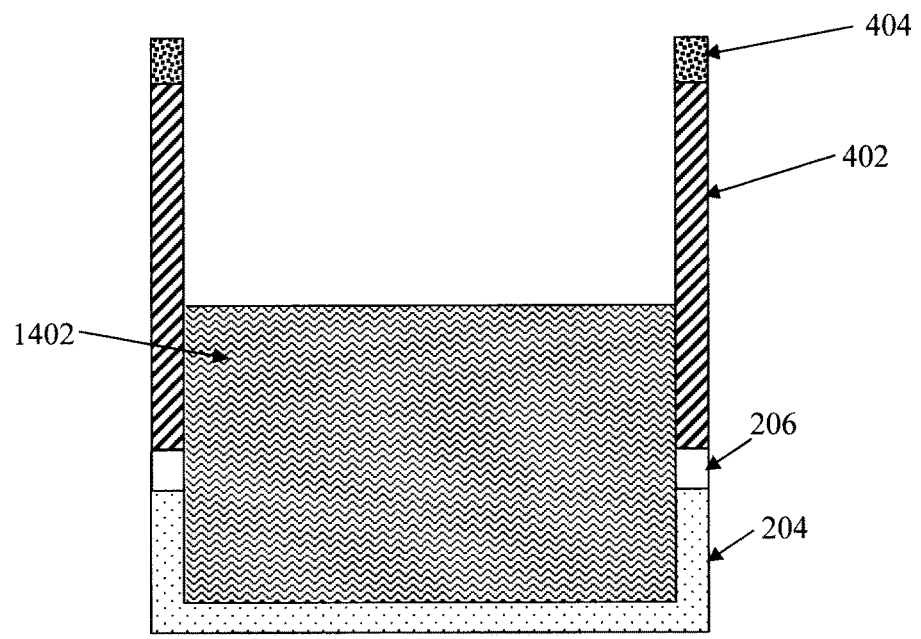
FIG. 16 is a cross-sectional diagram along y-y' illustrating the first dielectric having been recessed within the trench according to an embodiment of the present invention.

As shown in FIGS. 14 and 15, the dielectric 1402 overfills the trench. In this example, the dielectric 1402 is then recessed within the trench. See FIG. 16. FIG. 16 depicts a cross-sectional cut along the y-y' direction. It is notable that in another exemplary embodiment described below, the dielectric 1402 is left intact (i.e., without a recess etch).

Figure 17:
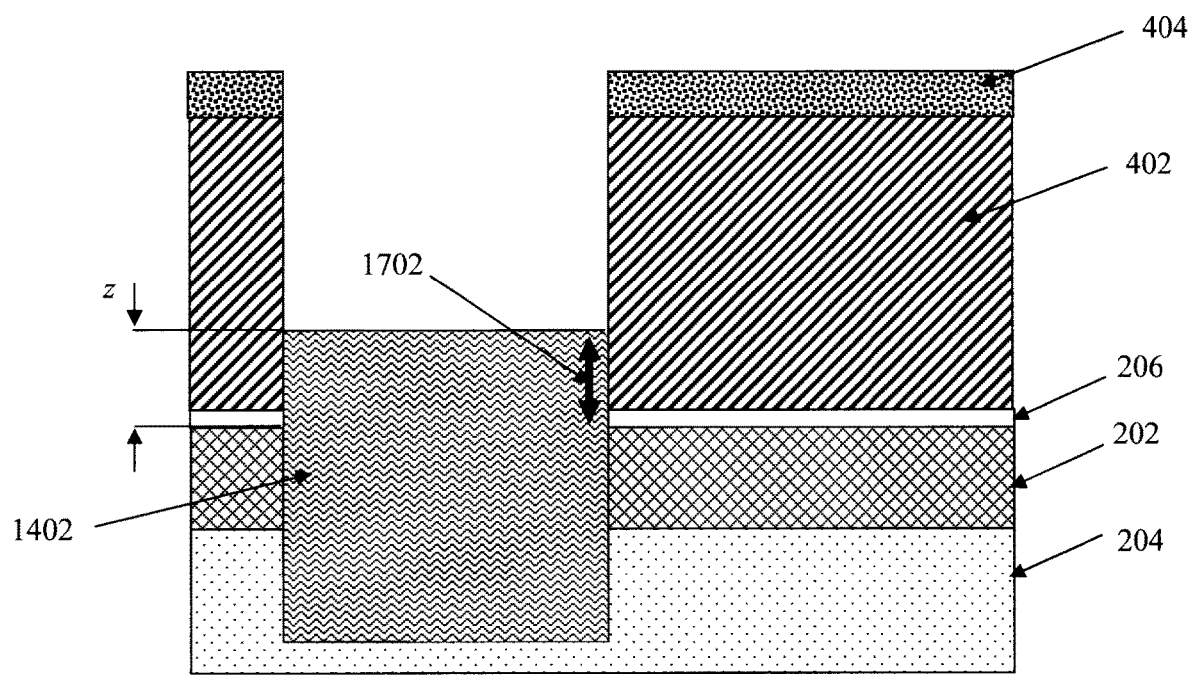
FIG. 17 is a cross-sectional diagram along x-x' illustrating, from another perspective, the first dielectric having been recessed within the trench according to an embodiment of the present invention.

A recess etch of the dielectric 1402 can be performed using an appropriate etch chemistry. For example, when the dielectric 1402 is a nitride material (e.g., SiN), then a nitride-selective RIE might be employed to recess the dielectric 1402. FIG. 17 is a cross-sectional diagram illustrating the dielectric recess etch from another perspective (i.e., a cross-sectional cut along the x-x' direction).

As shown in FIG. 17, the dielectric 1402 is recessed to a point that the dielectric 1402 (which now only partially fills the trench) is still present in the trench at a level above that of the fins 202. See, for example, arrow 1702 which indicates that there is some dielectric 1402 above the fins 202. This is done to prevent dummy gate-to-fin shorting. Also, the recess etch sets the aspect ratio of the dummy gate (that will be formed on top of the (recessed) dielectric 1402. As highlighted above, the goal is to reduce the aspect ratio of the dummy gate which helps prevent gate bending/flopping or collapse. The amount by which the dielectric 1402 extends above the fins 202 is based on the thickness of the oxide layer 206. Namely, the dielectric 1402 is preferably taller than the fins 202 by an amount z that is equal to the thickness of the oxide layer 206 plus at least about 2.5 times the thickness of the oxide layer 206. Thus, if z was equivalent to the thickness of the oxide layer 206, then the top of dielectric 1402 would be essentially coplanar with the top of oxide layer 206. However, as shown in FIG. 17, it is desirable for the top of dielectric 1402 to be higher than the top of oxide layer 206 (i.e., wherein z is at least 2.5× the thickness of the oxide layer 206. To use simple (non-limiting) example, if the oxide layer 206 has a thickness of 2 nm (see above), then z is at least about 5 nm. A maximum height of the dielectric 1402 can be as high as the tops of the gates (see alternative embodiment described below).

Figure 18:
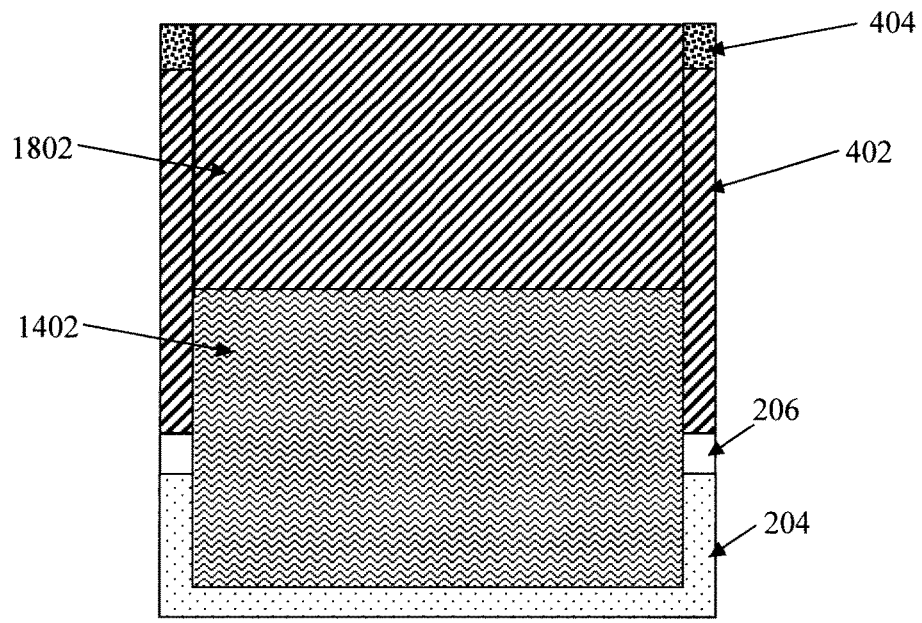
FIG. 18 is a cross-sectional diagram along y-y' illustrating the trench having been refilled with a second dummy gate material to cover the (recessed) first dielectric according to an embodiment of the present invention.
Figure 19:
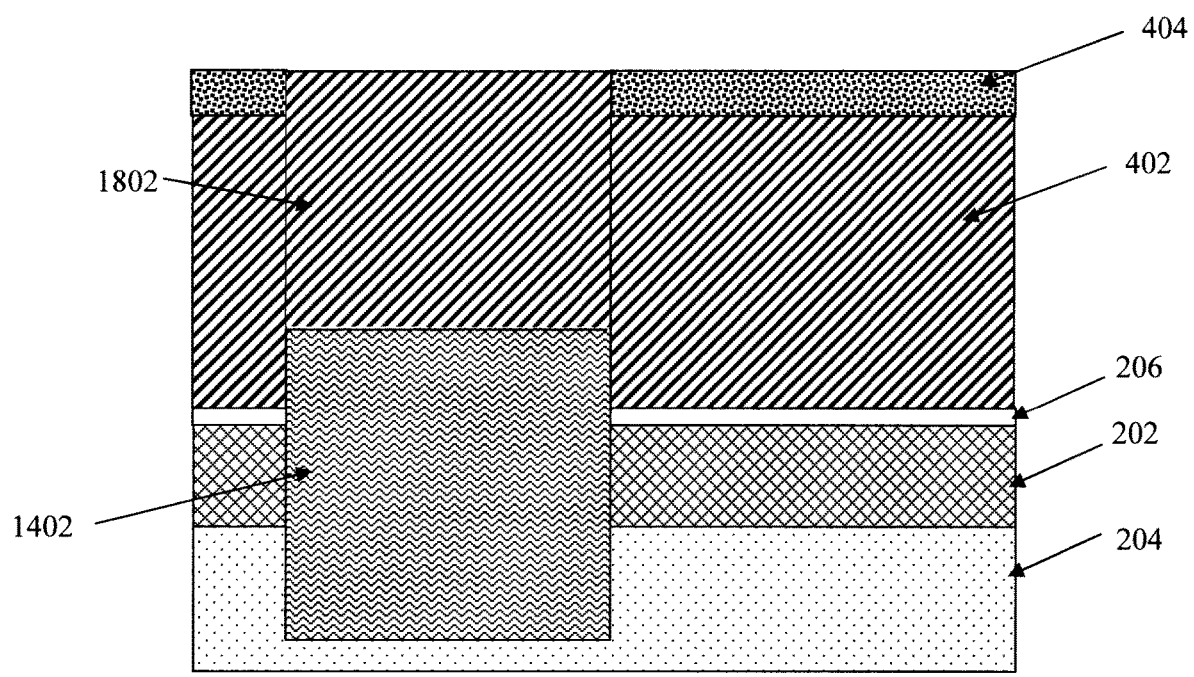
FIG. 19 is a cross-sectional diagram along x-x' illustrating, from another perspective, the trench having been refilled with a second dummy gate material to cover the (recessed) first dielectric according to an embodiment of the present invention.

The trench is then refilled with dummy gate material 1802 to cover the (recessed) dielectric 1402. See FIG. 18. FIG. 18 depicts a cross-sectional cut along the y-y' direction. The dummy gate material 1802 is given a different reference numeral than the dummy gate material 402 simply to differentiate the two structures. However in practice the same material (e.g., amorphous Si) is used in both, and hence dummy gate materials 402 and 1802 are represented using the same patterning in the figures. These dummy gate materials do not, however, have to be the same. FIG. 19 is a cross-sectional diagram illustrating the trench having been refilled with dummy gate material 1802 to cover the (recessed) dielectric 1402 from another perspective (i.e., a cross-sectional cut along the x-x' direction).

Figure 20:
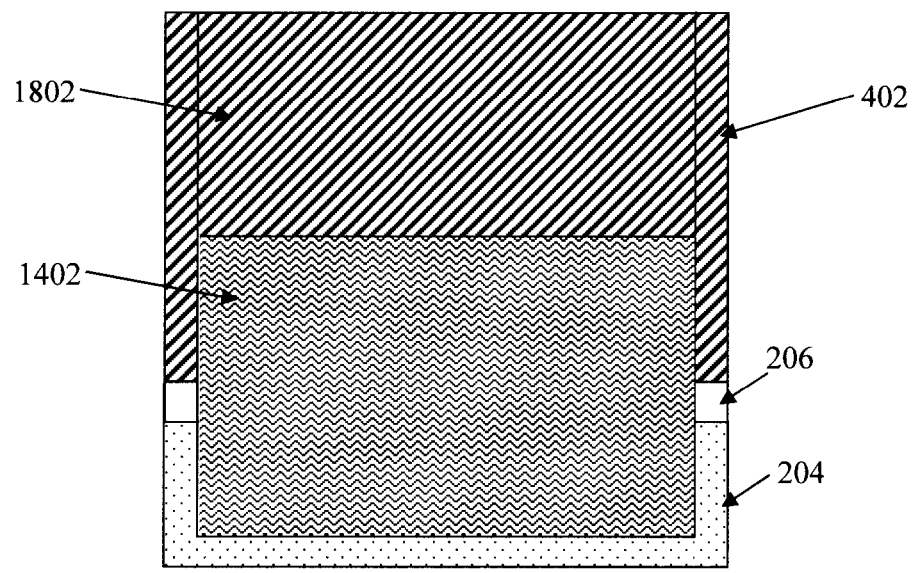
FIG. 20 is a cross-sectional diagram along y-y' illustrating the first/second dummy gate material having been planarized to a target dummy gate height according to an embodiment of the present invention.
Figure 21:
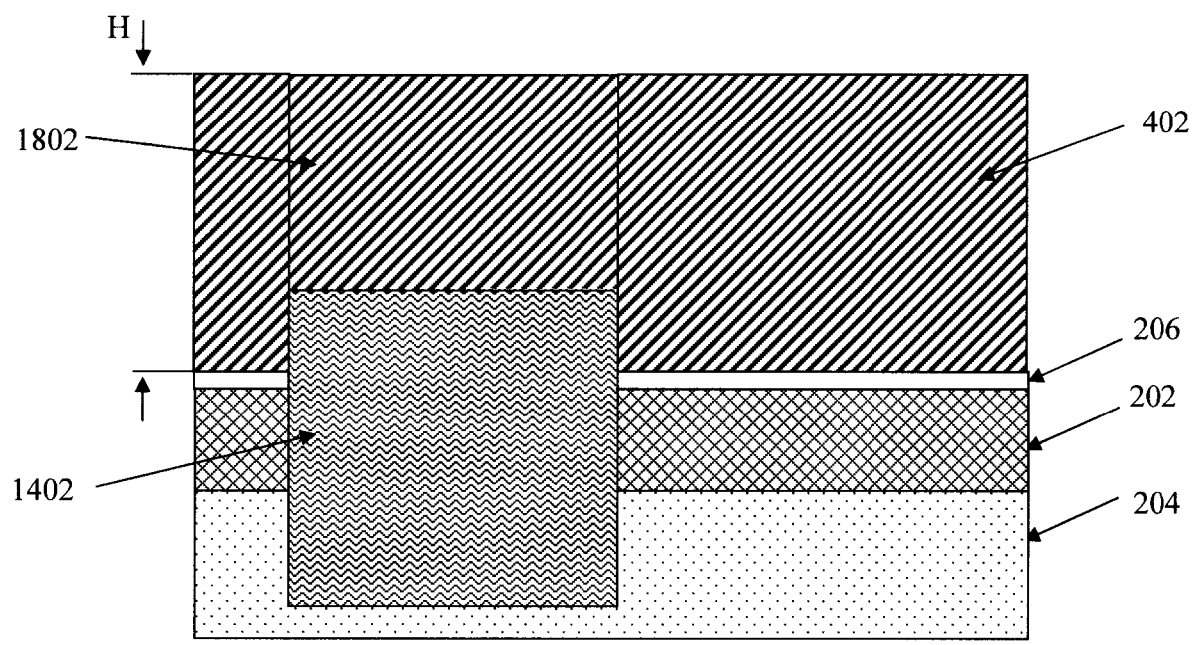
FIG. 21 is a cross-sectional diagram along x-x' illustrating, from another perspective, the first/second dummy gate material having been planarized to a target dummy gate height according to an embodiment of the present invention.

The hardmask 404 is then removed, and the dummy gate material 1802 is planarized to a target dummy gate height H. See FIGS. 20 and 21. FIG. 20 depicts a cross-sectional cut along the y-y' direction. The dummy gate material 1802 can be planarized using a process such as CMP. FIG. 21 is a cross-sectional diagram illustrating planarization of the dummy gate material 1802 to target dummy gate height H from another perspective (i.e., a cross-sectional cut along the x-x' direction). As described in conjunction with the description of FIG. 4, above, it is preferable to start with an excess amount (e.g., at least about 5 nm extra) of the dummy gate material 402. That excess amount is what is now being removed during the planarization.

The dummy gate materials 402/dummy gate material 1802 are then patterned into individual dummy gates. In the example that follows, a sidewall image transfer or SIT process is employed. However, that is merely an example, and direct patterning of the gates can instead be employed. SIT is a pitch doubling technique that can be used to achieve sub-lithographic dimensions. SIT generally involves forming a mandrel on a substrate, forming sidewall spacers on opposite sides of the mandrel, then removing the mandrel selective to the spacers, and using the spacers to pattern the underlying substrate. See, for example, U.S. Pat. No. 9,123,654 issued to Leobandung, entitled "Trilayer SIT Process with Transfer Layer for FINFET Patterning," the contents of which are incorporated by reference as if fully set forth herein. Thus, two gates can be patterned for each mandrel—hence SIT is a pitch doubling process.

Figure 22:
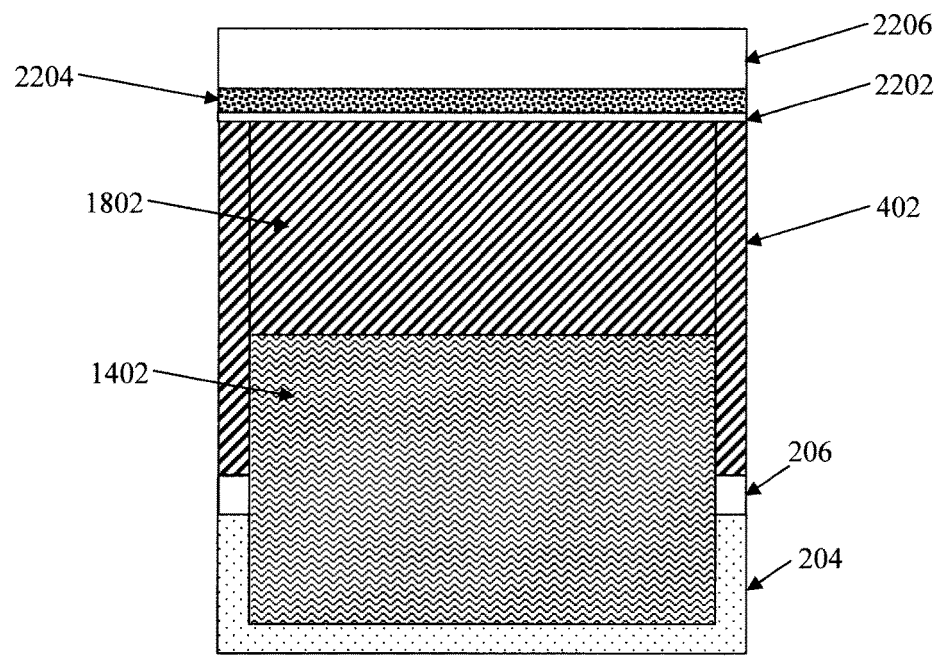
FIG. 22 is a cross-sectional diagram along y-y' illustrating the planarized first/second dummy gate material having been covered with a thin oxide layer followed by a nitride hardmask and an oxide hardmask according to an embodiment of the present invention.
Figure 23:
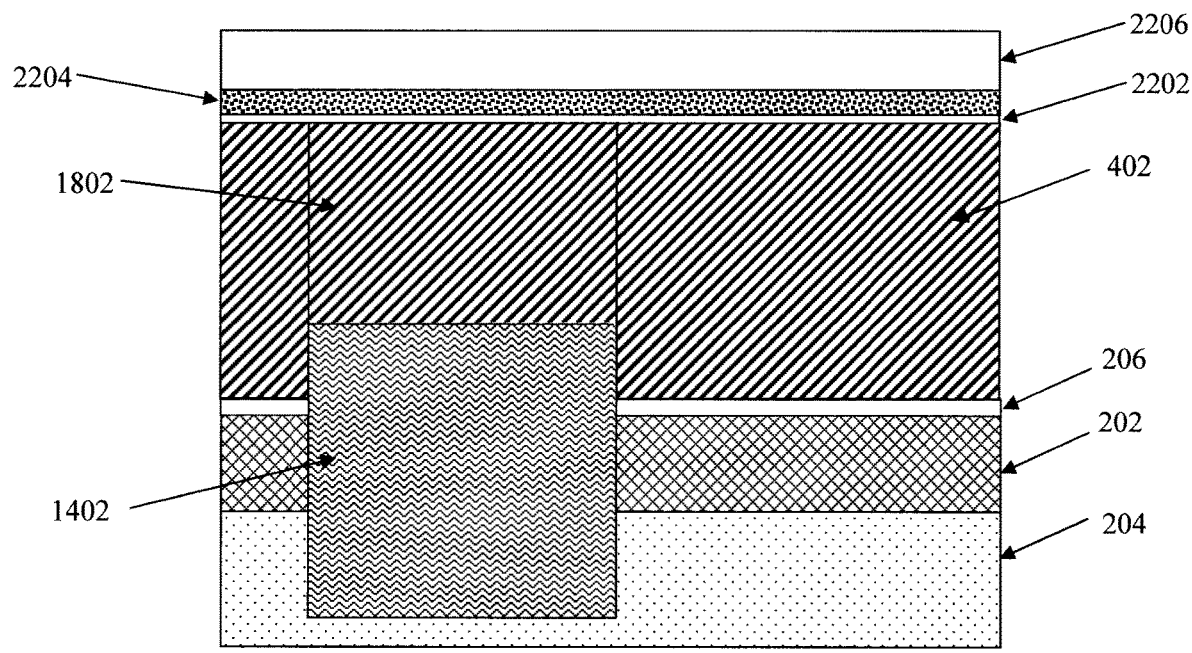
FIG. 23 is a cross-sectional diagram along x-x' illustrating, from another perspective, the planarized first/second dummy gate material having been covered with the thin oxide layer followed by the nitride hardmask and the oxide hardmask according to an embodiment of the present invention.

According to an exemplary embodiment, to begin the dummy gate patterning process the planarized dummy gate material 402/1802 is first covered with a thin (e.g., from about 2 nm to about 6 nm, and ranges therebetween) oxide (e.g., $SiO_2$) layer 2202 followed by a nitride (e.g., SiN) hardmask 2204 and an oxide (e.g., $SiO_2$) hardmask 2206. See FIGS. 22 and 23. FIG. 22 depicts a cross-sectional cut along the y-y' direction and FIG. 23 depicts a cross-sectional cut along the x-x' direction.

Figure 24:
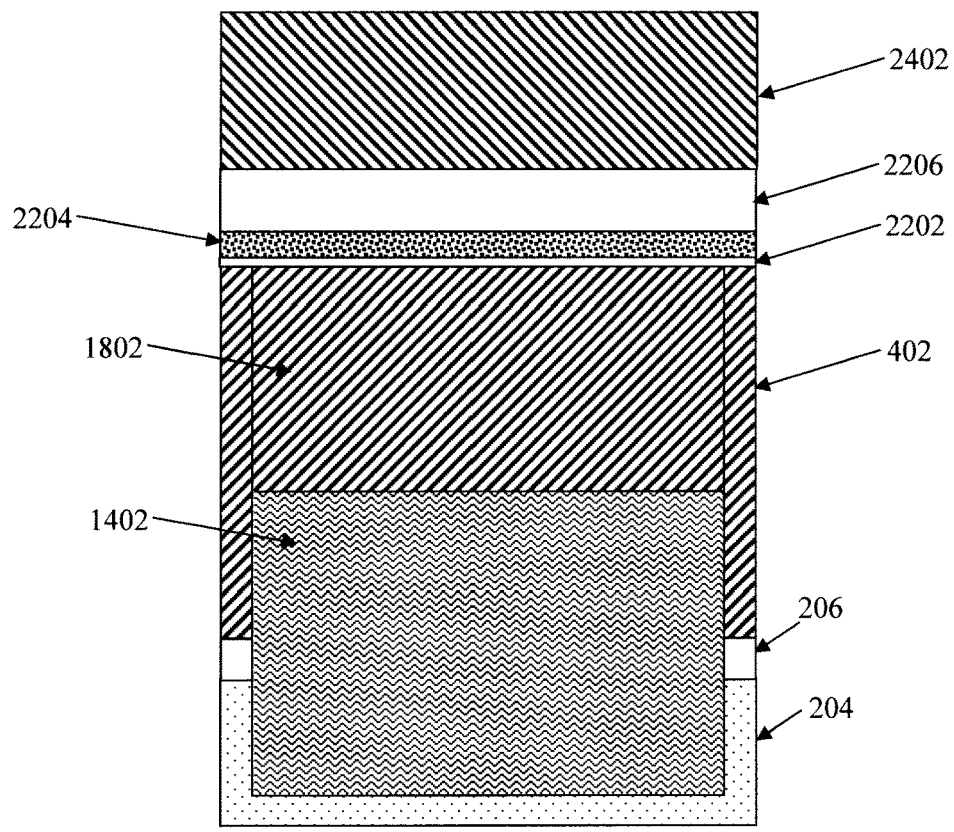
FIG. 24 is a cross-sectional diagram along y-y' illustrating sidewall image transfer (SIT) spacers having been formed on the oxide hardmask process according to an embodiment of the present invention.
Figure 25:
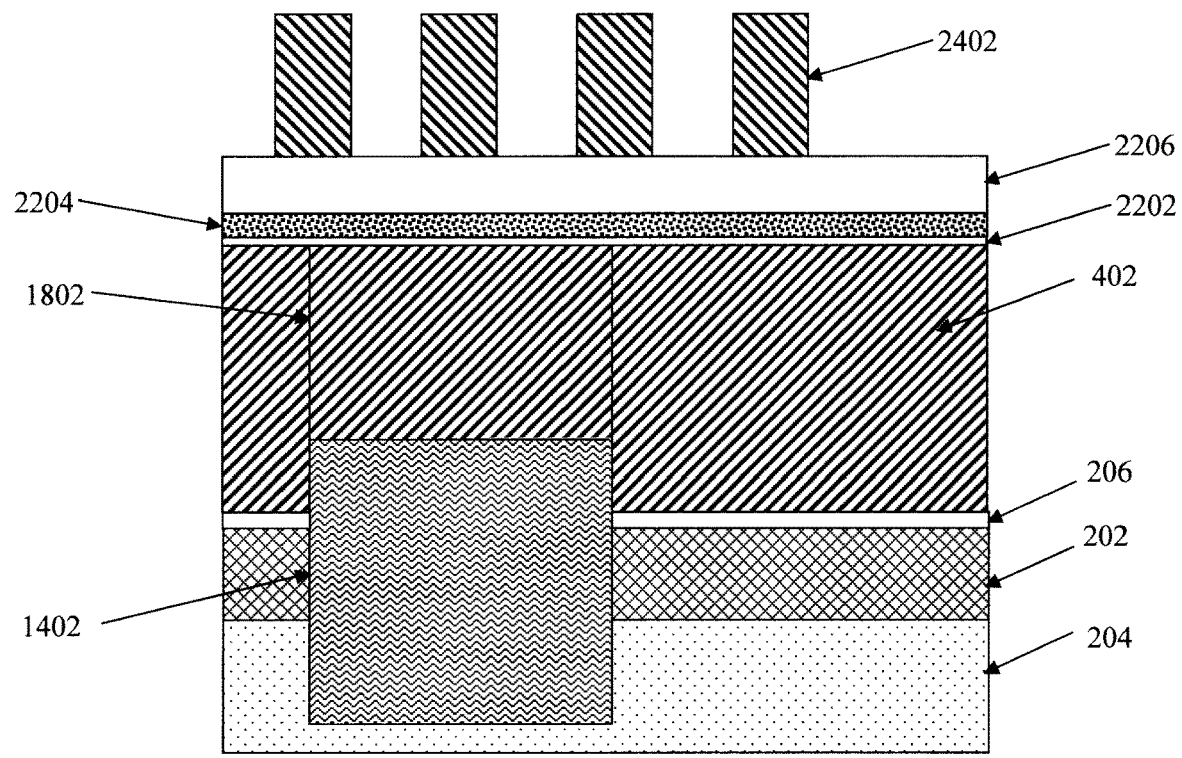
FIG. 25 is a cross-sectional diagram along x-x' illustrating, from another perspective, the SIT spacers having been formed on the oxide hardmask according to an embodiment of the present invention.

In the manner described above, mandrels (not shown) are then used to place spacers 2402 on the oxide hardmask 2206. See FIGS. 24 and 25. FIG. 24 depicts a cross-sectional cut along the y-y' direction and FIG. 25 depicts a cross-sectional cut along the x-x' direction. The spacers 2402 mark the footprint and location of multiple dummy gates that will be patterned in the dummy gate material 402/1802 (see below). According to an exemplary embodiment, the spacers 2402 are formed from amorphous silicon.

Figure 26:
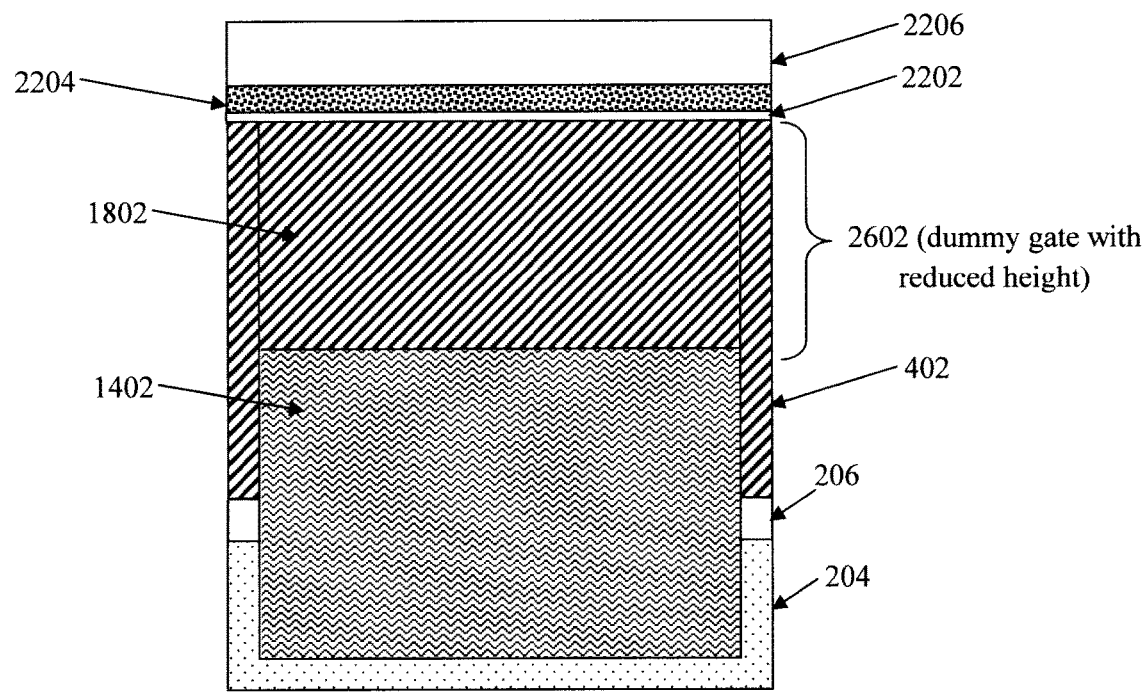
FIG. 26 is a cross-sectional diagram along y-y' illustrating the SIT spacers having been used to pattern the underlying oxide/nitride hardmasks and the pattern from the hardmasks having been transferred to the first/second dummy gate material to form multiple dummy gates according to an embodiment of the present invention.
Figure 27:
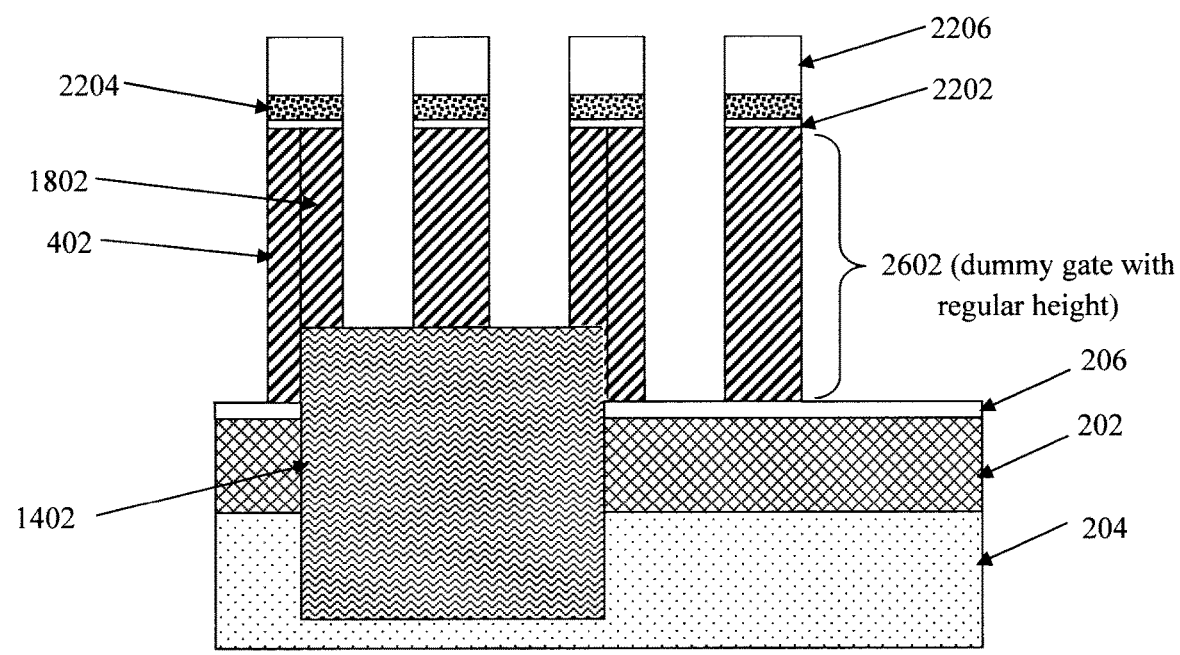
FIG. 27 is a cross-sectional diagram along x-x' illustrating, from another perspective, the SIT spacers having been used to pattern the underlying oxide/nitride hardmasks and the pattern from the hardmasks having been transferred to the first/second dummy gate material to form the dummy gates according to an embodiment of the present invention.

The spacers 2402 are then used to pattern the underlying oxide/nitride hardmasks 2206/2204 and the pattern from the hardmasks 2206/2204 is transferred to the dummy gate material 402/1802 to form multiple dummy gates 2602 (during which the spacers 2402 are removed). See FIGS. 26 and 27. FIG. 26 depicts a cross-sectional cut along the y-y' direction and FIG. 27 depicts a cross-sectional cut along the x-x' direction. The hardmask patterning can be carried out using a series of oxide- and nitride-selective (e.g., RIE) steps. A Si-selective etch can be used to transfer the dummy gate pattern into the dummy gate material 402/1802.

As shown in FIGS. 26 and 27, the dummy gates 2602 disposed on the dielectric 1402 (i.e., those dummy gates 2602 in the fin cut region) have a reduced (width to height) aspect ratio as compared to the dummy gates 2602 disposed on the fins 202. Thus, while those dummy gates 2602 in the fin cut region are not anchored by a fin, the reduced aspect ratio helps prevent those dummy gates from flopping or collapsing.

Figure 28:
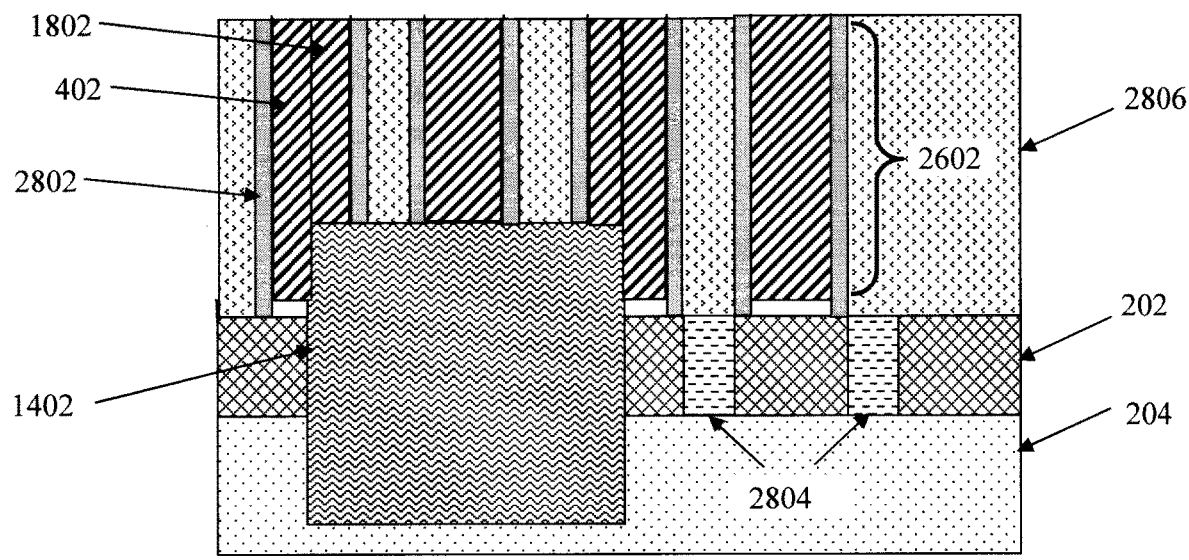
FIG. 28 is a cross-sectional diagram along x-x' illustrating gate spacers and source and drain regions having been formed on opposite sides of the dummy gates, a second dielectric having been deposited surrounding the dummy gates, and the second dielectric having been polished to expose the tops of the dummy gates according to an embodiment of the present invention.

As highlighted above, the dummy gates serve as placeholders (for the replacement gates, see below) and permit placement of source and drain regions, and gate spacers which offset the gates from the source and drain regions. For instance, as shown in FIG. 28, gate spacers 2802 and epitaxial source and drain regions 2804 (which are offset from the dummy gates 2602 by the gate spacers 2802) have been formed on opposite sides of the dummy gates 2602. FIG. 28 depicts a cross-sectional cut along the x-x' direction.

Next, as shown in FIG. 28, in order to permit selective removal and replacement of the dummy gates 2602, a dielectric 2806 is deposited surrounding the dummy gates 2602. Suitable dielectrics include, but are not limited to oxide (e.g., $SiO_2$) or nitride (SiN) materials. The dielectric 2806 is polished (e.g., using CMP) and the oxide layer 2202/nitride hardmask 2204/oxide hardmask 2206 is selectively etched to expose the tops of the dummy gates 2602, which also serves to remove the hardmasks 2206/2204. See FIG. 28.

Figure 29:
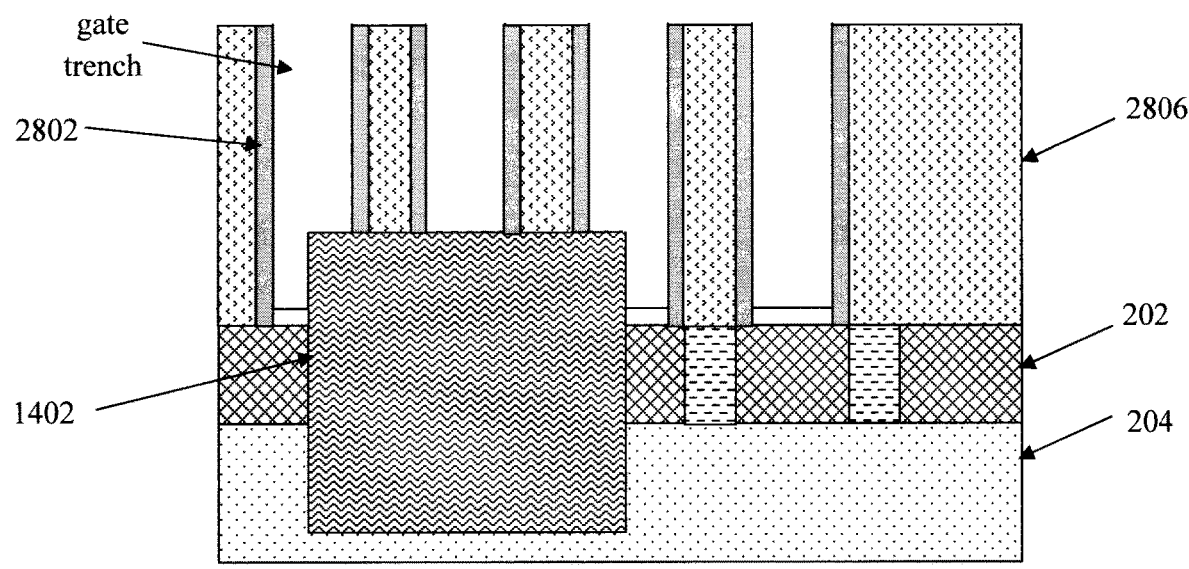
FIG. 29 is a cross-sectional diagram along x-x' illustrating the dummy gates having been selectively removed from the second dielectric, forming gate trenches in the dielectric according to an embodiment of the present invention.
Figure 30:
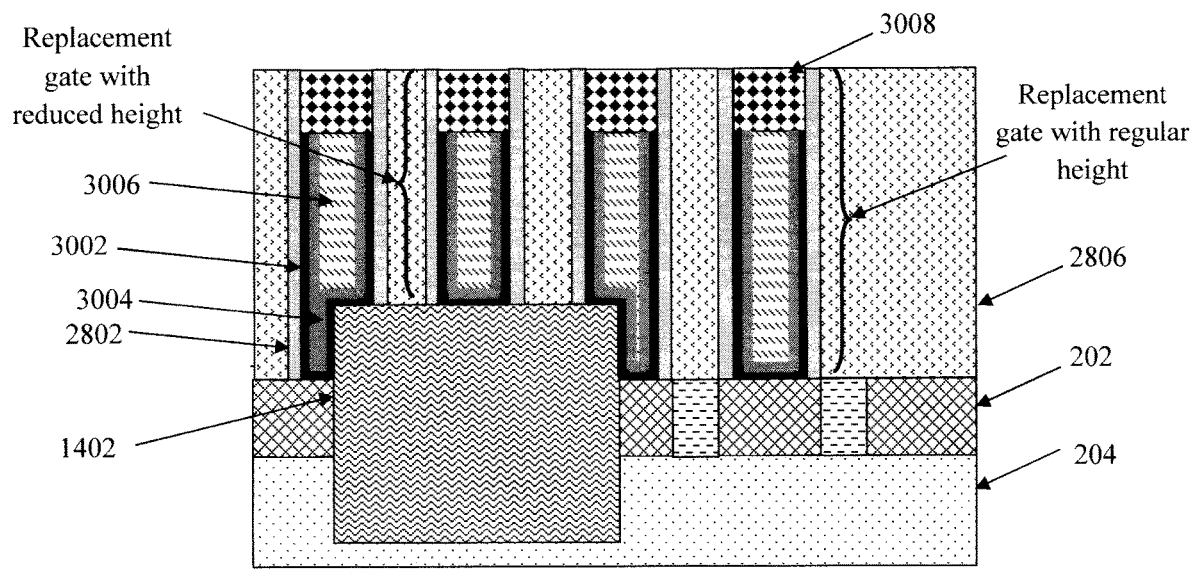
FIG. 30 is a cross-sectional diagram along x-x' illustrating replacement gates having been formed in the gate trenches according to an embodiment of the present invention.

As shown in FIG. 29, the dummy gates 2602 are now selectively removed from the dielectric 2806, forming gate trenches in the dielectric 2806. FIG. 29 depicts a cross-sectional cut along the x-x' direction. Replacement gates are then formed in the gate trenches. See FIG. 30. FIG. 30 depicts a cross-sectional cut along the x-x' direction.

By way of example only, the replacement gates are formed by depositing: a gate dielectric 3002 into the gate trenches, a workfunction setting metal 3004 on the gate dielectric 3002, a fill metal 3006 on the workfunction setting metal 3004, and a contact cap 3008 over these layers. According to an exemplary embodiment, the gate dielectric 3002 is a high-κ material such as hafnium oxide ($HfO_2$), aluminum oxide ($Al_2O_3$), or lanthanum oxide ($La_2O_3$). The term "high-κ" as used herein refers to a material having a relative dielectric constant κ which is much higher than that of silicon dioxide (e.g., a dielectric constant κ=25 for $HfO_2$ rather than 4 for silicon dioxide).

The particular workfunction setting metal 3004 employed can vary depending on whether an n-type or p-type finFET is being formed. Suitable n-type workfunction metals include, but are not limited to, titanium nitride (TiN), tantalum nitride (TaN), and aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and tantalum aluminum carbide (TaAlC). Suitable p-type workfunction metals include, but are not limited to, TiN, TaN, and tungsten (W). The fill metal 3006 is preferably a low resistance gate metal such as tungsten (W) or aluminum (Al).

Finally, a contact cap 3008 completes the replacement gates. See FIG. 30. According to an exemplary embodiment, the contact cap 3008 is a dielectric contact cap that is used for self-aligned source/drain contact patterning to prevent gate to source/drain shorting and eventual formation of the gate contact. For a general discussion of a self-aligned contact (SAC) technique in the context of a replacement metal gate process flow see, for example, U.S. Patent Application Publication Number 2015/0263131 by Metz, entitled "Method of Forming Self-Aligned Contacts Using a Replacement Metal Gate Process in a Semiconductor Device," the contents of which are incorporated by reference as if fully set forth herein. Suitable dielectric materials for the contact cap 3008 include, but are not limited to, silicon nitride (SiN).

As described above, the dummy gates 2602 disposed on the dielectric 1402 (i.e., those dummy gates 2602 in the fin cut region) have a reduced (height to width) aspect ratio as compared to the dummy gates 2602 disposed on the fins 202. Thus, since the replacement gates are formed in the gate trenches left by removal of the dummy gates, the same conditions apply. Specifically, the replacement gates disposed on the dielectric 1402 (i.e., those replacement gates in the fin cut region) have a reduced (height to width) aspect ratio as compared to the replacement gates disposed on the fins 202. See FIG. 30.

In the above exemplary process flow, the dielectric 1402 over the fin cut region is recessed and dummy gate material 1802 is deposited on top of the dielectric 1402. However, according to another exemplary embodiment, rather than recessing the dielectric 1402, the dielectric 1402 is left all the way to the top of the trench (see FIG. 15). This alternative embodiment is now described.

The same above general process flow is implemented in this example with a few notable changes. Thus, for ease and clarity of description, reference is made to the above description for those process steps that have already been described. Further, like structures are numbered alike in the figures. In this example, the process begins in the same general manner as described above whereby fins 202 have been patterned in substrate 204, strain in the fins 202 has been pinned using dummy gate material 402, a trench has been patterned over the (fin cut) region of the fins 202, and a dielectric 1402 has been deposited into, and filling, the trench. See above-described process up to, and including the description of FIGS. 14 and 15.

Figure 31:
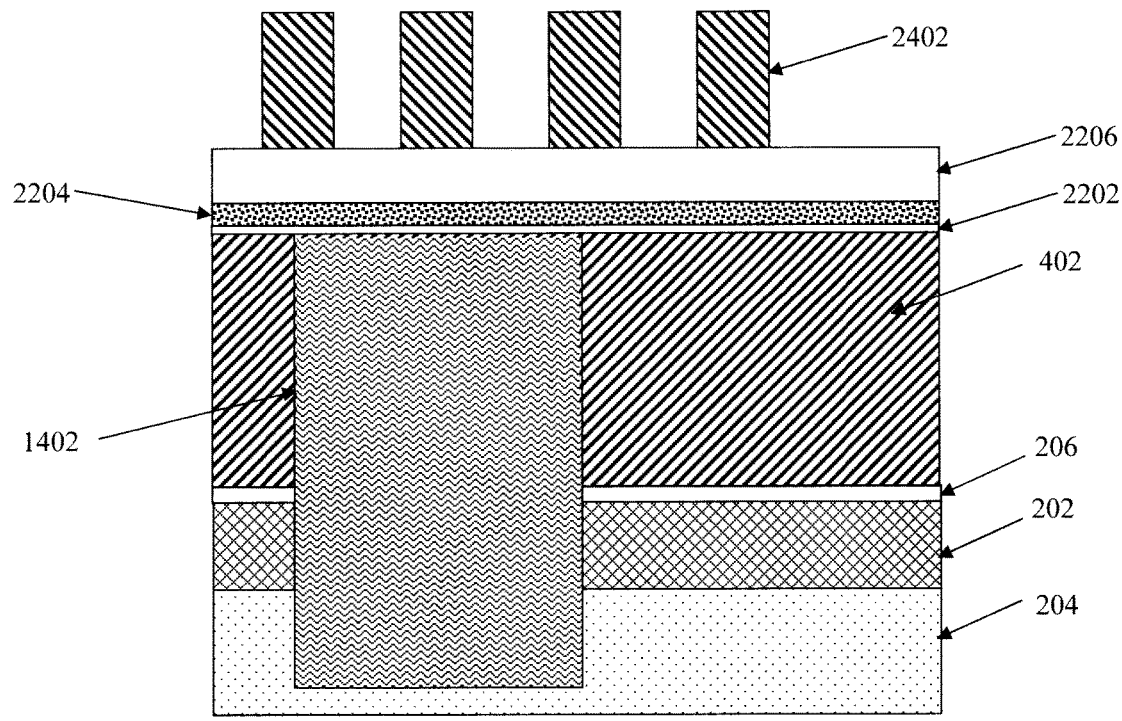
FIG. 31 is a cross-sectional diagram along x-x' illustrating, according to an alternative embodiment, no recessing of the first dielectric having been performed according to an embodiment of the present invention.

It is at this point that a notable departure from the above example occurs. Thus, following from the structure depicted in FIGS. 14 and 15, in FIG. 31 it is shown that (in the same manner as described above), the dummy gate material 402 along with the trench fill (which in this case is entirely dielectric 1402) has been planarized, an oxide layer 2202/nitride hardmask 2204/oxide hardmask 2206 stack has been formed on the planarized dummy gate material 402/dielectric 1402, and (SIT) spacers 2402 have been formed on the oxide hardmask 2206. FIG. 31 depicts a cross-sectional cut along the x-x' direction.

Figure 32:
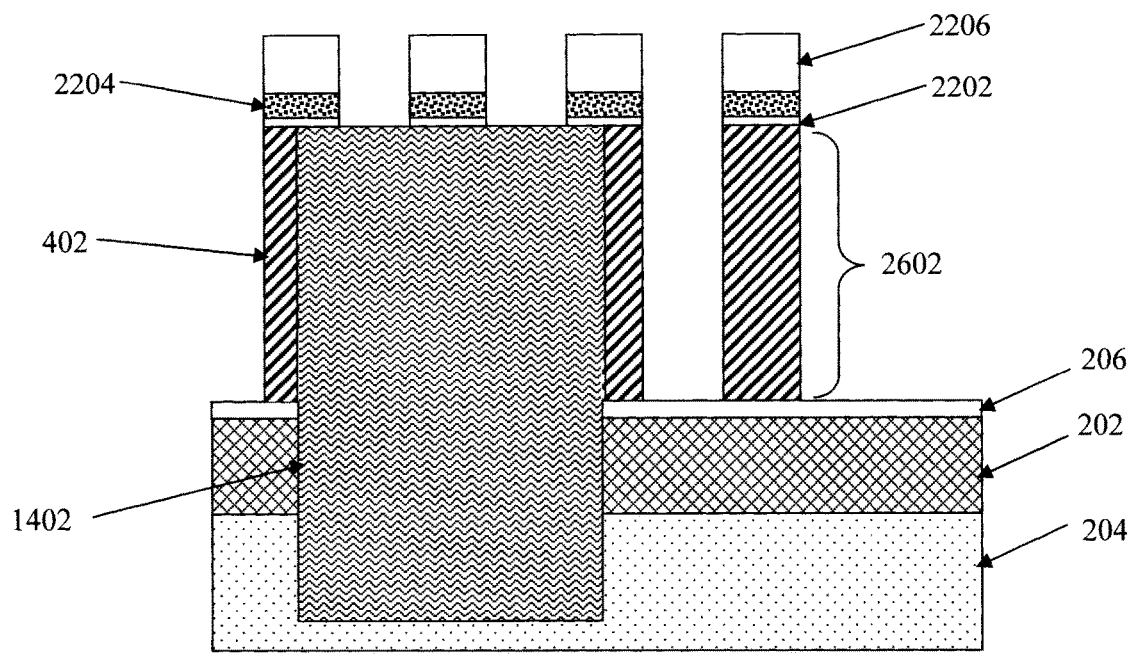
FIG. 32 is a cross-sectional diagram along x-x', following from FIG. 31, illustrating dummy gates having been patterned according to an embodiment of the present invention.
Figure 33:
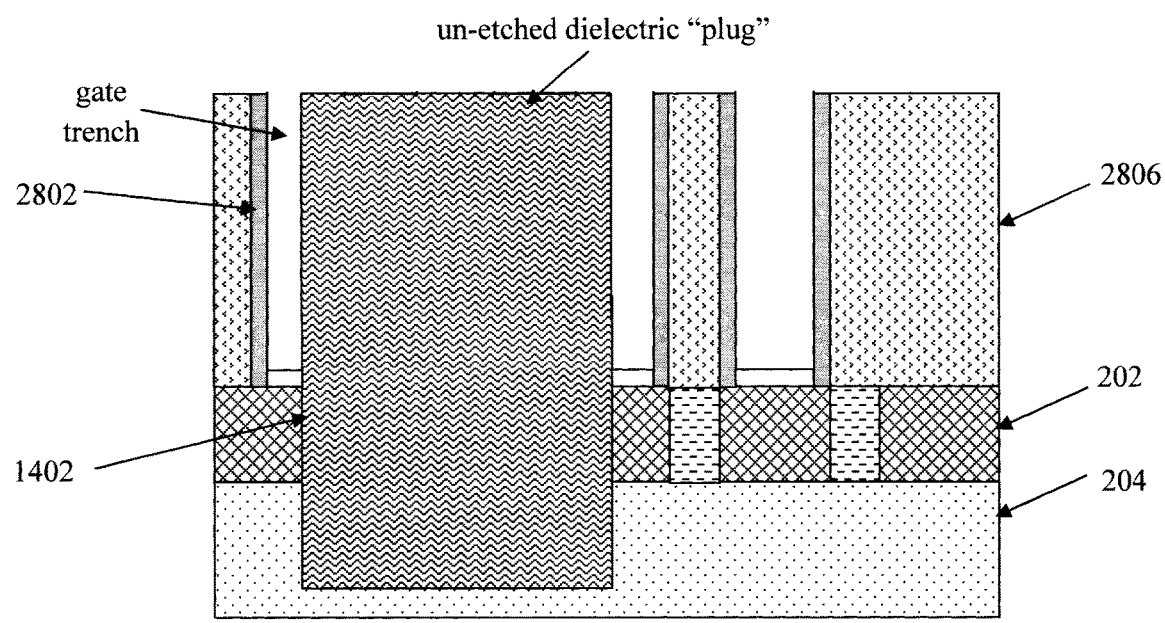
FIG. 33 is a cross-sectional diagram along x-x', following from FIG. 32, illustrating a second dielectric having been deposited surrounding the dummy gates, and the dummy gates having been removed, and replacement gates having been formed place of the dummy gates according to an embodiment of the present invention.
Figure 34:
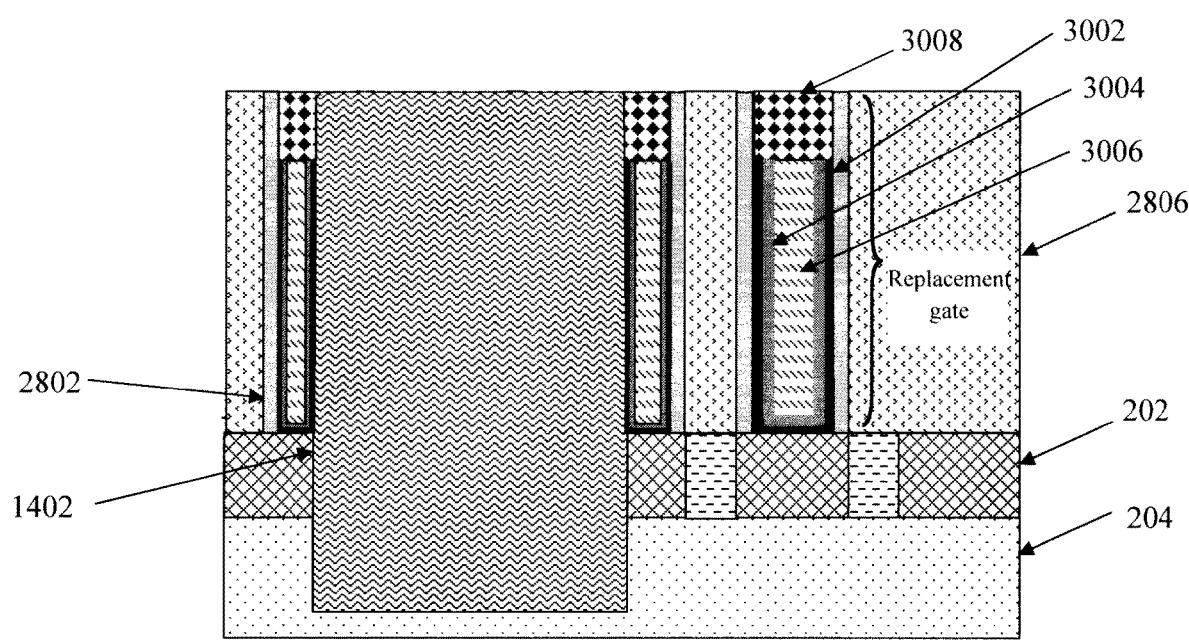
FIG. 34 is a cross-sectional diagram along x-x', following from FIG. 33, illustrating replacement gates having been formed place of the dummy gates according to an embodiment of the present invention.

The process proceeds in the same manner as described above to pattern the dummy gates 2602 (see FIG. 32), deposit a second dielectric 1402, remove the dummy gates 2602 (see FIG. 33), and form replacement gates in their place (see FIG. 34). FIGS. 32, 33 and 34 depict cross-sectional cuts along the x-x' direction.

As shown in FIG. 32, without recessing, the dielectric 1402 in this example is at the same height as the patterned dummy gates 2602. Another way to look at it is that the tops of the dielectric 1402 and the dummy gates 2602 are coplanar. Since the replacement gates are formed in the gate trenches left by removal of the dummy gates, the same condition applies. Specifically, the dielectric 1402 is at the same height as the replacement gates (i.e., the tops of the dielectric 1402 and the replacement gates are coplanar). See FIG. 34. It is notable that in the example depicted in FIGS. 31-34, the dielectric 1402 is not significantly etched during the dummy gate patterning, and thus the dielectric 1402 remains as an intact "plug" post-dummy gate patterning. However, if so desired, the dielectric 1402 can be etched to form pillars (not shown) similar to gates, e.g., using a nitride-selective etch.

In the above examples, it has been generally assumed that all of the devices being formed from the fin arrays receive the same treatments. That is however not a requirement. For example, one might wish to improve carrier mobility by imparting tensile strain in those devices that are n-channel finFETs while alternatively imparting compressive strain in those devices that are p-channel finFETs. According to an exemplary embodiment, this is accomplished by tuning the dielectric 1402 to be either a tensile or compressive strain imparting material. Of course, this will require selective blocking/masking of the p-channel finFETs while processing of the n-channel finFETs is being carried out, and vice versa. See, for example, FIG. 35 described below.

By way of example only, $SiO_2$ and SiN can be configured to induce tensile or compressive strain. For instance, SiN is tensile in conventional monolayer deposition processes (such as molecular layer deposition (MLD), atomic layer deposition (ALD), plasma enhanced atomic layer deposition (PEALD) using remote plasma). However, PEALD of SiN using a direct plasma exposure can become compressive and can result in 100's of millipascals (MPa) of stress (higher temperature causing stress >800 MPa in some cases). Compressive strain $SiO_2$ can be achieved using plasma enhanced chemical vapor deposition (PECVD). See, for example, Mackenzie et al., "Stress Control of Si-Based PECVD Dielectrics," Proc. Symp. Silicon Nitride and Silicon Dioxide Thin Insulating Films & Other Emerging Dielectrics VIII, PV2005-01, 148-159 (May 2005), the contents of which are incorporated by reference as if fully set forth herein.

Figure 35:
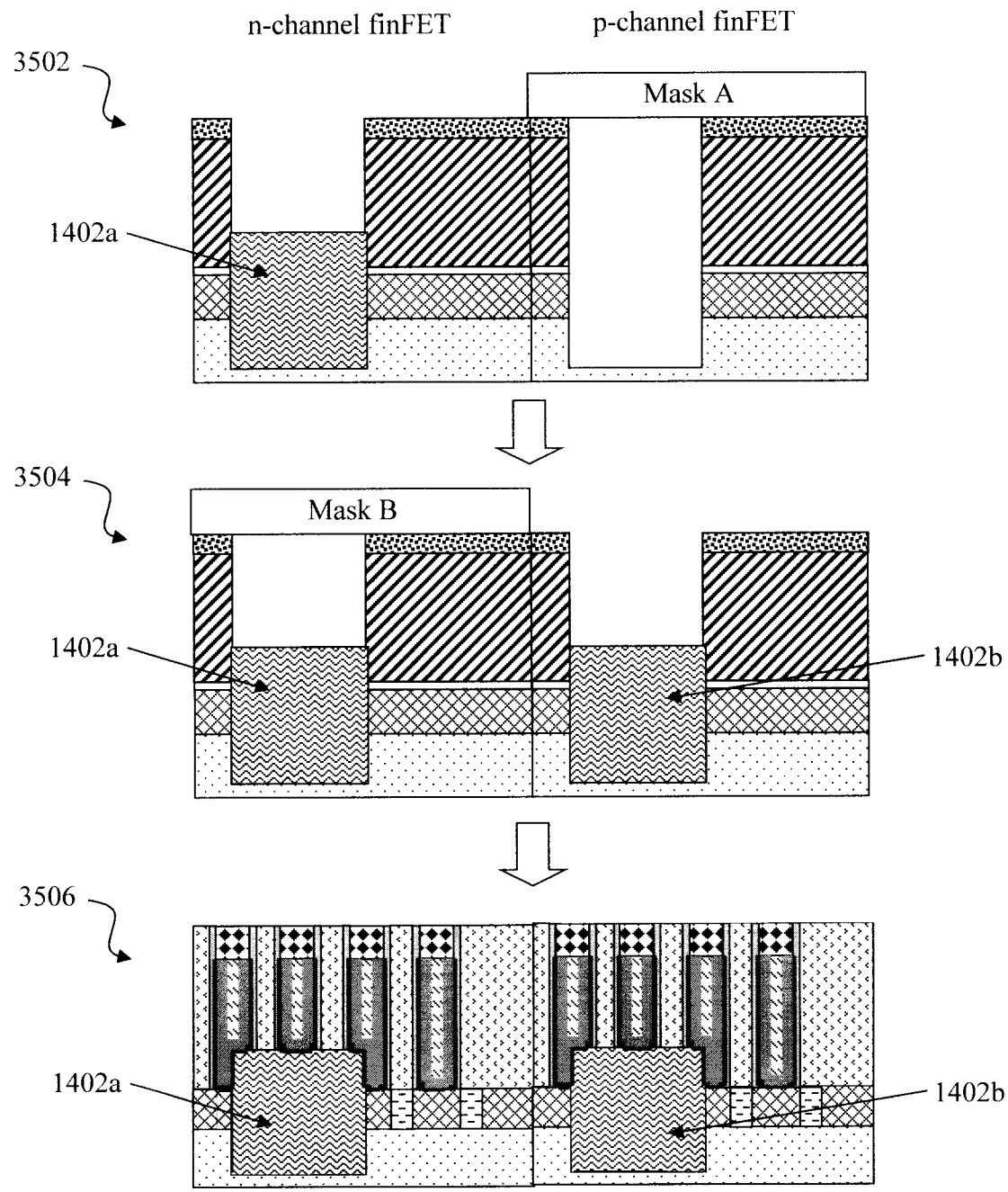
FIG. 35 is a diagram illustrating an exemplary methodology for separately processing n-channel and p-channel finFET devices according to an embodiment of the present invention.

As shown in methodology 3500 of FIG. 35, when different treatments are employed for n-channel and p-channel finFETs, such as use of tensile strain versus compressive strain-imparting dielectrics 1402a and 1402b, respectively, then selective masking is needed. Namely, in the same manner as described above, after the fin cut, in step 3502 a mask A is selectively formed over one or more of the fins (arbitrarily those corresponding to the p-channel finFETs in this example), and the above-described process is used to deposit and process a tensile strain imparting dielectric 1402a (e.g., recess the tensile strain imparting dielectric 1402a if so desired, or leave as full fill—see above). The mask A is then removed, and in step 3504 a mask B is selectively formed over the n-channel finFETs, and the above-described process is used to deposit and process a compressive strain imparting dielectric 1402b (e.g., recess the tensile strain imparting dielectric 1402b if so desired, or leave as full fill—see above). The mask B is then removed and in step 3506 the balance of the process is performed to complete the devices.

Figure 36:
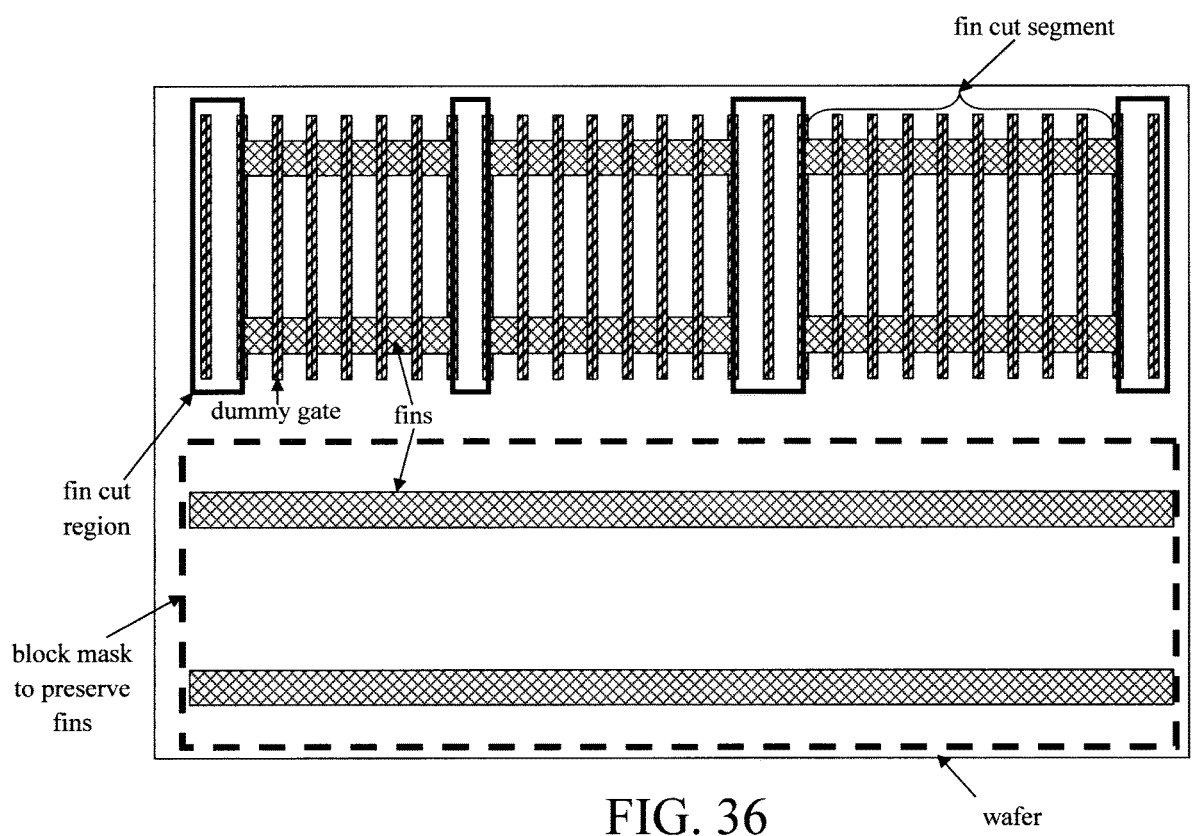
FIG. 36 is a diagram illustrating an exemplary schematic diagram of a block mask according to an embodiment of the present invention.

As provided above, a block mask can be employed in accordance with the present techniques. See, for example, FIG. 36. As shown in the example in FIG. 36, a block mask is used to preserve some fins (those that will not be end cut) while exposing other fins to be end cut in the same manner as described in detail above.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A fin field-effect transistor (finFET), comprising:
    at least one fin on a substrate, wherein a cut is present in the at least one fin that divides the at least one fin into multiple segments;
    a first dielectric within the cut separating the multiple segments of the at least one fin, wherein the first dielectric has a rectangular cross-sectional shape;
    gates over the at least one fin, wherein the gates comprise at least one first gate that is disposed on, and in direct contact with, only the first dielectric, at least one second gate that is disposed on, and in direct contact with, only the at least one fin, and at least two third gates that are disposed on, and in direct contact with, both the first dielectric and the at least one fin, wherein the at least one first gate has an aspect ratio and a height that are less than an aspect ratio and a height of the at least one second gate, and wherein the at least one first gate is present in between the at least two third gates; and
    a second dielectric surrounding the gates.

2. The finFET of claim 1, further comprising:
    a recess in the substrate beneath the cut in the at least one fin.

3. The finFET of claim 2, wherein the first dielectric is present within the recess.

4. The finFET of claim 2, wherein the recess in the substrate has a depth d of from about 50 nanometers to about 300 nanometers, and ranges therebetween.

5. The finFET of claim 1, wherein each of the gates comprises:
    a gate dielectric;
    a workfunction setting metal on the gate dielectric; and
    a fill metal on the workfunction setting metal.

6. The finFET of claim 5, wherein the gate dielectric comprises a high-κ dielectric.

7. The finFET of claim 6, wherein the high-κ dielectric is selected from the group consisting of: hafnium oxide, aluminum oxide, and lanthanum oxide.

8. The finFET of claim 5, wherein the workfunction setting metal comprises an n-type workfunction setting metal selected from the group consisting of: titanium nitride, tantalum nitride, titanium aluminide, titanium aluminum nitride, titanium aluminum carbide, tantalum aluminide, tantalum aluminum nitride, and tantalum aluminum carbide.

9. The finFET of claim 5, wherein the workfunction setting metal comprises a p-type workfunction setting metal selected from the group consisting of: titanium nitride, tantalum nitride, and tungsten.

10. The finFET of claim 5, wherein the fill metal is selected from the group consisting of: tungsten and aluminum.

11. The finFET of claim 1, wherein the first dielectric and the second dielectric are each selected from the group consisting of: silicon dioxide and silicon nitride.

12. A finFET, comprising:
    at least one fin on a substrate, wherein a cut is present in the at least one fin that divides the at least one fin into multiple segments;
    a first dielectric within the cut separating the multiple segments of the at least one fin, wherein the first dielectric has a rectangular cross-sectional shape;
    gates over the at least one fin, wherein the first dielectric is at a same height as the gates, and wherein the first dielectric is in direct contact with a gate dielectric along lateral surfaces of two of the gates; and
    a second dielectric surrounding the gates.

13. The finFET of claim 12, further comprising:
    a recess in the substrate beneath the cut in the at least one fin, wherein the first dielectric is present within the recess.

14. The finFET of claim 12, wherein each of the gates comprises:
    a gate dielectric;
    a workfunction setting metal on the gate dielectric; and
    a fill metal on the workfunction setting metal.

15. The finFET of claim 14, wherein the gate dielectric comprises a high-κ dielectric.

16. The finFET of claim 15, wherein the high-κ dielectric is selected from the group consisting of: hafnium oxide, aluminum oxide, and lanthanum oxide.

17. The finFET of claim 14, wherein the workfunction setting metal comprises an n-type workfunction setting metal selected from the group consisting of: titanium nitride, tantalum nitride, titanium aluminide, titanium aluminum nitride, titanium aluminum carbide, tantalum aluminide, tantalum aluminum nitride, and tantalum aluminum carbide.

18. The finFET of claim 14, wherein the workfunction setting metal comprises a p-type workfunction setting metal selected from the group consisting of: titanium nitride, tantalum nitride, and tungsten.

19. The finFET of claim 14, wherein the fill metal is selected from the group consisting of: tungsten and aluminum.

20. The finFET of claim 12, wherein the first dielectric and the second dielectric are each selected from the group consisting of: silicon dioxide and silicon nitride.

* * * * *